(12) United States Patent
Wang et al.

(10) Patent No.: US 9,257,302 B1
(45) Date of Patent: Feb. 9, 2016

(54) CVD FLOWABLE GAP FILL

(75) Inventors: Feng Wang, Fremont, CA (US); Victor Y. Lu, Santa Cruz, CA (US); Brian Lu, Fremont, CA (US); Wai-Fan Yau, Los Altos, CA (US); Nerissa Draeger, Fremont, CA (US); Vishal Gauri, Fremont, CA (US); Raashina Humayun, Fremont, CA (US); Michal Danek, Cupertino, CA (US); Bart van Schravendijk, Sunnyvale, CA (US); Lakshminarayana Nittala, Sunnyvale, CA (US)

(73) Assignee: Novellus Systems, Inc., Fremont, CA (US)

( * ) Notice: Subject to any disclaimer, the term of this patent is extended or adjusted under 35 U.S.C. 154(b) by 33 days.

(21) Appl. No.: 13/461,287

(22) Filed: May 1, 2012
(Under 37 CFR 1.47)

Related U.S. Application Data

(63) Continuation-in-part of application No. 12/625,468, filed on Nov. 24, 2009, now Pat. No. 8,187,951, which is a continuation of application No. 11/925,514, filed on Oct. 26, 2007, now Pat. No. 7,629,227, application
(Continued)

(51) Int. Cl.
*H01L 21/316* (2006.01)

(52) U.S. Cl.
CPC ........ *H01L 21/316* (2013.01); *H01L 21/31604* (2013.01)

(58) Field of Classification Search
CPC .............. H01L 21/316; H01L 21/3165; H01L 21/31604
See application file for complete search history.

(56) References Cited

U.S. PATENT DOCUMENTS

| | | | |
|---|---|---|---|
| 4,099,990 A | 7/1978 | Brown et al. |
| 4,740,480 A | 4/1988 | Ooka |
| 4,923,720 A | 5/1990 | Lee et al. |
| 5,281,274 A | 1/1994 | Yoder |
| 5,320,983 A | 6/1994 | Ouellet |
| 5,387,546 A | 2/1995 | Maeda et al. |

(Continued)

FOREIGN PATENT DOCUMENTS

| | | |
|---|---|---|
| CN | 1655330 A | 8/2005 |
| CN | 1722403 A | 1/2006 |

(Continued)

OTHER PUBLICATIONS

U.S. Office Action mailed Aug. 23, 2005, from U.S. Appl. No. 10/810,066.

(Continued)

*Primary Examiner* — William Coleman
(74) *Attorney, Agent, or Firm* — Weaver Austin Villeneuve & Sampson LLP

(57) ABSTRACT

Provided are methods of filling gaps on a substrate by creating flowable silicon oxide-containing films. The methods involve introducing vapor-phase silicon-containing precursor and oxidant reactants into a reaction chamber containing the substrate under conditions such that a condensed flowable film is formed on the substrate. The flowable film at least partially fills gaps on the substrate. In certain embodiments, the methods involve using a catalyst in the formation of the film. The catalyst may be incorporated into one of the reactants and/or introduced as a separate reactant.

17 Claims, 12 Drawing Sheets

Related U.S. Application Data

No. 13/461,287, which is a continuation-in-part of application No. 12/984,524, filed on Jan. 4, 2011, now Pat. No. 8,481,403, which is a continuation of application No. 12/411,243, filed on Mar. 25, 2009, now Pat. No. 7,888,233, which is a continuation of application No. 11/447,594, filed on Jun. 5, 2006, now Pat. No. 7,524,735, which is a continuation-in-part of application No. 10/810,066, filed on Mar. 25, 2004, now Pat. No. 7,074,690, and a continuation-in-part of application No. 11/323,812, filed on Dec. 29, 2005, now Pat. No. 7,582,555.

(60) Provisional application No. 60/856,193, filed on Nov. 1, 2006.

(56) References Cited

U.S. PATENT DOCUMENTS

| | | | |
|---|---|---|---|
| 5,516,721 A | 5/1996 | Galli et al. | |
| 5,525,157 A | 6/1996 | Hawkins et al. | |
| 5,534,731 A | 7/1996 | Cheung | |
| 5,747,381 A | 5/1998 | Wu et al. | |
| 5,753,886 A | 5/1998 | Iwamura et al. | |
| 5,807,785 A | 9/1998 | Ravi | |
| 5,840,631 A | 11/1998 | Kubo et al. | |
| 5,858,880 A | 1/1999 | Dobson et al. | |
| 5,874,367 A | 2/1999 | Dobson | |
| 5,899,751 A | 5/1999 | Chang et al. | |
| 5,902,127 A | 5/1999 | Park | |
| 5,932,289 A | 8/1999 | Dobson et al. | |
| 5,970,383 A | 10/1999 | Lee | |
| 5,990,013 A | 11/1999 | Berenguer et al. | |
| 6,013,581 A | 1/2000 | Wu et al. | |
| 6,054,379 A | 4/2000 | Yau et al. | |
| 6,060,384 A | 5/2000 | Chen et al. | |
| 6,072,227 A | 6/2000 | Yau et al. | |
| 6,114,224 A | 9/2000 | Ngo et al. | |
| 6,114,259 A | 9/2000 | Sukharev et al. | |
| 6,143,626 A | 11/2000 | Yabu et al. | |
| 6,207,535 B1 | 3/2001 | Lee et al. | |
| 6,218,268 B1 | 4/2001 | Xia et al. | |
| 6,242,366 B1 | 6/2001 | Beekman et al. | |
| 6,287,989 B1 | 9/2001 | Dobson | |
| 6,300,219 B1 | 10/2001 | Doan et al. | |
| 6,309,933 B1 | 10/2001 | Li et al. | |
| 6,323,123 B1 | 11/2001 | Liu et al. | |
| 6,383,951 B1 | 5/2002 | Li | |
| 6,399,213 B2 | 6/2002 | Shiokawa | |
| 6,413,583 B1 | 7/2002 | Moghadam et al. | |
| 6,448,187 B2 | 9/2002 | Yau et al. | |
| 6,475,564 B1 | 11/2002 | Carter et al. | |
| 6,544,858 B1 | 4/2003 | Beekman et al. | |
| 6,613,695 B2 | 9/2003 | Pomarede et al. | |
| 6,635,586 B2 | 10/2003 | Goo et al. | |
| 6,640,840 B1 | 11/2003 | MacNeil | |
| 6,653,247 B2 | 11/2003 | MacNeil | |
| 6,660,663 B1 | 12/2003 | Cheung et al. | |
| 6,743,436 B1 | 6/2004 | Lee | |
| 6,743,736 B2 | 6/2004 | Mardian et al. | |
| 6,787,463 B2 | 9/2004 | Mardian et al. | |
| 6,790,737 B2 | 9/2004 | Schneegans et al. | |
| 6,812,135 B2 | 11/2004 | Li et al. | |
| 6,828,162 B1 | 12/2004 | Halliyal et al. | |
| 6,846,757 B2 | 1/2005 | MacNeil | |
| 6,858,195 B2 | 2/2005 | Aronowitz et al. | |
| 6,902,947 B2 | 6/2005 | Chinn et al. | |
| 6,972,262 B2 | 12/2005 | Lee et al. | |
| 6,984,561 B2 | 1/2006 | Herner et al. | |
| 6,995,056 B2 | 2/2006 | Lee et al. | |
| 7,033,945 B2 | 4/2006 | Byun et al. | |
| 7,056,560 B2 | 6/2006 | Yim et al. | |
| 7,071,126 B2 | 7/2006 | Johnston et al. | |
| 7,074,690 B1 | 7/2006 | Gauri et al. | |
| 7,074,727 B2 | 7/2006 | Hsu et al. | |
| 7,084,505 B2 * | 8/2006 | Hamada et al. | 257/758 |
| 7,153,783 B2 | 12/2006 | Lu et al. | |
| 7,211,525 B1 | 5/2007 | Shanker et | |
| 7,238,604 B2 | 7/2007 | Kloster et al. | |
| 7,271,112 B1 | 9/2007 | Papasouliotis et al. | |
| 7,365,000 B2 | 4/2008 | Lee et al. | |
| 7,498,273 B2 * | 3/2009 | Mallick et al. | 438/308 |
| 7,521,378 B2 | 4/2009 | Fucsko et al. | |
| 7,524,735 B1 | 4/2009 | Gauri et al. | |
| 7,575,633 B2 | 8/2009 | Romanin | |
| 7,582,555 B1 | 9/2009 | Lang et al. | |
| 7,585,704 B2 | 9/2009 | Belyansky et al. | |
| 7,589,012 B1 | 9/2009 | Seo et al. | |
| 7,622,369 B1 | 11/2009 | Lee et al. | |
| 7,629,227 B1 | 12/2009 | Wang et al. | |
| 7,648,927 B2 | 1/2010 | Singh et al. | |
| 7,655,532 B1 | 2/2010 | Chen et al. | |
| 7,727,906 B1 | 6/2010 | Shanker et al. | |
| 7,794,544 B2 * | 9/2010 | Nguyen et al. | 118/715 |
| 7,804,130 B1 | 9/2010 | Fung | |
| 7,825,044 B2 | 11/2010 | Mallick et al. | |
| 7,888,233 B1 | 2/2011 | Gauri et al. | |
| 7,888,273 B1 | 2/2011 | Wang et al. | |
| 7,915,139 B1 | 3/2011 | Lang et al. | |
| 7,999,356 B2 | 8/2011 | Nakasaki et al. | |
| 8,178,159 B2 | 5/2012 | Baikerikar et al. | |
| 8,187,951 B1 * | 5/2012 | Wang et al. | 438/452 |
| 8,278,224 B1 | 10/2012 | Mui et al. | |
| 8,481,403 B1 | 7/2013 | Gauri et al. | |
| 8,557,712 B1 | 10/2013 | Antonelli et al. | |
| 8,580,697 B1 | 11/2013 | Lang et al. | |
| 8,685,867 B1 | 4/2014 | Danek et al. | |
| 8,728,958 B2 | 5/2014 | Ashtiani et al. | |
| 8,809,161 B2 | 8/2014 | Gauri et al. | |
| 8,846,536 B2 | 9/2014 | Draeger et al. | |
| 9,064,684 B1 | 6/2015 | Mui et al. | |
| 2002/0006729 A1 | 1/2002 | Geiger et al. | |
| 2003/0040199 A1 | 2/2003 | Agarwal | |
| 2003/0066482 A1 | 4/2003 | Pokharna et al. | |
| 2003/0077887 A1 | 4/2003 | Jang et al. | |
| 2003/0146416 A1 | 8/2003 | Takei et al. | |
| 2003/0159655 A1 | 8/2003 | Lin et al. | |
| 2003/0194861 A1 | 10/2003 | Mardian et al. | |
| 2003/0210065 A1 | 11/2003 | Lu et al. | |
| 2004/0048455 A1 | 3/2004 | Karasawa et al. | |
| 2004/0152342 A1 | 8/2004 | Li et al. | |
| 2004/0169005 A1 | 9/2004 | Kim et al. | |
| 2004/0224496 A1 | 11/2004 | Cui et al. | |
| 2005/0026443 A1 | 2/2005 | Goo et al. | |
| 2005/0112282 A1 | 5/2005 | Gordon | |
| 2005/0136684 A1 | 6/2005 | Mukai et al. | |
| 2005/0150453 A1 | 7/2005 | Simmons et al. | |
| 2005/0181566 A1 | 8/2005 | Machida et al. | |
| 2005/0191863 A1 | 9/2005 | Olmer et al. | |
| 2005/0212179 A1 | 9/2005 | Honda et al. | |
| 2005/0260864 A1 | 11/2005 | Huang et al. | |
| 2006/0014384 A1 | 1/2006 | Lee et al. | |
| 2006/0024912 A1 | 2/2006 | Lee | |
| 2006/0216946 A1 | 9/2006 | Usami et al. | |
| 2006/0223290 A1 | 10/2006 | Belyansky et al. | |
| 2006/0269693 A1 | 11/2006 | Balseanu et al. | |
| 2006/0270217 A1 | 11/2006 | Balseanu et al. | |
| 2007/0054505 A1 | 3/2007 | Antonelli et al. | |
| 2007/0281495 A1 | 12/2007 | Mallick et al. | |
| 2007/0298585 A1 | 12/2007 | Lubomirsky et al. | |
| 2008/0020591 A1 | 1/2008 | Balseanu et al. | |
| 2008/0081434 A1 | 4/2008 | Nam et al. | |
| 2008/0132087 A1 | 6/2008 | Xia et al. | |
| 2008/0318439 A1 | 12/2008 | Ito et al. | |
| 2009/0020847 A1 | 1/2009 | Byun et al. | |
| 2009/0053895 A1 | 2/2009 | Oshima et al. | |
| 2009/0061647 A1 | 3/2009 | Mallick et al. | |
| 2009/0104789 A1 | 4/2009 | Mallick et al. | |
| 2009/0104790 A1 | 4/2009 | Liang | |
| 2009/0298257 A1 | 12/2009 | Lee et al. | |
| 2009/0321936 A1 | 12/2009 | Kojima et al. | |
| 2010/0109155 A1 | 5/2010 | Liu et al. | |
| 2010/0167533 A1 | 7/2010 | Lim et al. | |
| 2011/0081782 A1 | 4/2011 | Liang et al. | |

(56) References Cited

U.S. PATENT DOCUMENTS

| | | | |
|---|---|---|---|
| 2011/0151678 | A1 | 6/2011 | Ashtiani et al. |
| 2012/0149213 | A1 | 6/2012 | Nittala et al. |
| 2012/0161405 | A1 | 6/2012 | Mohn et al. |
| 2012/0164328 | A1 | 6/2012 | Kojima et al. |
| 2013/0122718 | A1 | 5/2013 | Kato et al. |
| 2013/0230987 | A1 | 9/2013 | Draeger et al. |
| 2014/0017904 | A1 | 1/2014 | Gauri et al. |
| 2014/0150647 | A1 | 6/2014 | Ahn et al. |
| 2014/0302689 | A1 | 10/2014 | Ashtiani et al. |
| 2015/0004806 | A1 | 1/2015 | Ndiege et al. |
| 2015/0044882 | A1 | 2/2015 | Draeger et al. |
| 2015/0118862 | A1 | 4/2015 | Reilly et al. |
| 2015/0118863 | A1 | 4/2015 | Rathod et al. |

FOREIGN PATENT DOCUMENTS

| | | |
|---|---|---|
| CN | 101079391 A | 11/2007 |
| EP | 1 063 692 A1 | 12/2000 |
| JP | 2001-148382 | 5/2001 |
| JP | 2010-153859 | 7/2010 |
| WO | WO 99/22043 A1 | 5/1999 |
| WO | WO 2007/140376 | 12/2007 |
| WO | WO 2007/140424 | 12/2007 |
| WO | WO 2011/072143 | 6/2011 |

OTHER PUBLICATIONS

Lang et al., "CVD Flowable Gap Fill," Novellus Systems, Inc., U.S. Appl. No. 11/323,812, filed Dec. 29, 2005, pp. 1-21.
Notice of Allowance and Fee Due mailed Feb. 15, 2006 from U.S. Appl. No. 10/810,066.
Allowed Claims from U.S. Appl. No. 10/810,066.
Gauri et al., "Flowable Film Dielectric Gap Fill Process," Novellus Systems, Inc., U.S. Appl. No. 11/447,594, filed Jun. 5, 2006.
U.S. Office Action mailed Jun. 27, 2008, from U.S. Appl. No. 11/447,594.
U.S. Office Action mailed Oct. 26, 2007, from U.S. Appl. No. 11/323,812.
U.S. Office Action mailed Apr. 9, 2008, from U.S. Appl. No. 11/323,812.
U.S. Office Action mailed Oct. 9, 2008, from U.S. Appl. No. 11/323,812.
Wang, et al., "CVD Flowable Gap Fill," Novellus Systems, Inc., U.S. Appl. No. 11/925,514, filed Oct. 26, 2007.
Wang, et al., "Density Gradient-Free Gap Fill," Novellus Systems, Inc., U.S. Appl. No. 11/834,581, filed Aug. 6, 2007.
Notice of Allowance and Fee Due mailed Dec. 11, 2008, from U.S. Appl. No. 11/447,594.
Allowed Claims from U.S. Appl. No. 11/447,594.
U.S. Office Action mailed Nov. 4, 2008, from U.S. Appl. No. 11/925,514.
U.S. Office Action mailed Nov. 12, 2008, from U.S. Appl. No. 11/834,581.
Antonelli et al., "PECVD Flowable Dielectric Gap Fill," Novellus Systems, Inc., U.S. Appl. No. 12/334,726, filed Dec. 15, 2008.
Gauri et al., "Flowable Film Dielectric Gap Fill Process," Novellus Systems, Inc., U.S. Appl. No. 12/411,243, filed Mar. 25, 2009.
Notice of Allowance and Fee Due mailed Apr. 23, 2009 from U.S. Appl. No. 11/323,812.
Allowed Claims from U.S. Appl. No. 11/323,812.
U.S. Final Office Action mailed Jun. 17, 2009, from U.S. Appl. No. 11/925,514.
Notice of Allowance and Fee Due mailed Jul. 29, 2009 from U.S. Appl. No. 11/925,514.
Allowed Claims from U.S. Appl. No. 11/925,514.
Mui et al., "Flowable Oxide Deposition Using Rapid Delivery of Process Gases," Novellus Systems, Inc., U.S. Appl. No. 12/566,085, filed Sep. 24, 2009.
Lang et al., "CVD Flowable Gap Fill", Novellus Systems, Inc., U.S. Appl. No. 12/508,461, filed Jul. 23, 2009.

Chung, et al., "Flowable Oxide CVD Process for Shallow Trench Isolation in Silicon Semiconductor," Journal of Semiconductor Technology and Science, vol. 4, No. 1, Mar. 2004, pp. 45-51.
U.S. Final Office Action mailed Aug. 6, 2009, from U.S. Appl. No. 11/834,581.
U.S. Office Action mailed Dec. 18, 2009, from U.S. Appl. No. 11/834,581.
Wang et al., "CVD Flowable Gap Fill", Novellus Systems, Inc., U.S. Appl. No. 12/625,468, filed Nov. 24, 2009.
U.S. Office Action mailed Feb. 26, 2010, from U.S. Appl. No. 12/334,726.
U.S. Final Office Action mailed Apr. 22, 2010, for U.S. Appl. No. 11/834,581.
U.S. Office Action mailed May 24, 2010, for U.S. Appl. No. 12/411,243.
U.S. Final Office Action mailed Sep. 13, 2010 for U.S. Appl. No. 12/411,243.
U.S. Final Office Action mailed Oct. 26, 2010 for U.S. Appl. No. 12/334,726.
Notice of Allowance mailed Oct. 6, 2010 for U.S. Appl. No. 12/411,243.
Allowed Claims for U.S. Appl. No. 12/411,243.
Notice of Allowance mailed Nov. 18, 2010 for U.S. Appl. No. 12/508,461.
Allowed Claims for U.S. Appl. No. 12/508,461.
Notice of Allowance mailed Oct. 7, 2010 for U.S. Appl. No. 11/834,581.
Allowed Claims for U.S. Appl. No. 11/834,581.
Ashtiani et al., "Novel Gap Fill Integration," Novellus Systems, Inc., U.S. Appl. No. 12/964,110, filed Dec. 9, 2010.
Lang et al., "CVD Flowable Gap Fill", Novellus Systems, Inc., U.S. Appl. No. 13/031,077, filed Feb. 18, 2011.
Matsuura, M., et al., "Novel Self-Planarizing CVD Oxide for Interlayer Dielectric Applications," IEEE, 1994, pp. 117-120.
Hatanaka, M., et al., "$H_2O$-TEOS Plasma-CVD Realizing Dielectrics Having a Smooth Surface," IEEE, VMIC Conference, Jun. 11-12, 1991, pp. 435-441.
Sakaue, H., et al., "Digital Chemical Vapor Deposition of $SiO_2$ Using a Repetitive Reaction of Triethylsilane /Hydrogen and Oxidation," Department of Electrical Engineering, Hiroshima University, published Nov. 17, 1990, pp. L 124-L 127.
Nakano, M., et al., "Digital CVD of $SiO_2$," Extended Abstracts of the $21^{st}$ Conference on Solid State Devices and Materials, Tokyo, 1989, pp. 49-52.
Noguchi, S., et al., "Liquid Phase Oxidation Employing O Atoms Produced by Microwave Discharge and $Si(CH_3)_4$," Extended Abstracts of the $19^{th}$ Conference on Solid State Devices and Materials, Tokyo, 1987, pp. 451-454.
Chung, Sung-Woong, et al., "Novel Shallow Trench Isolation Process Using Flowable Oxide CVD for sub-100nm DRAM," IEEE, 2002, IEDM, pp. 233-236.
U.S. Office Action for U.S. Appl. No. 12/625,468 mailed Apr. 26, 2011.
Gauri et al., "Flowable Film Dielectric Gap Fill Process," Novellus Systems, Inc., U.S. Appl. No. 12/984,524, filed Jan. 4, 2011.
International Search Report and Written Opinion mailed Aug. 10, 2011 for Application No. PCT/US2010/059721.
U.S. Office Action for U.S. Appl. No. 12/334,726 mailed Sep. 16, 2011.
U.S. Final Office Action for U.S. Appl. No. 12/625,468 mailed Oct. 14, 2011.
Wang, et al., "Density Gradient-Free Gap Fill," Novellus Systems, Inc., U.S. Appl. No. 12/986,070, filed Jan. 6, 2011.
U.S. Office Action for U.S. Appl. No. 12/986,070 mailed Nov. 25, 2011.
Danek, et al., "Premetal Dielectric Integration Process," Novellus Systems, Inc., U.S. Appl. No. 13/315,123, filed Dec. 8, 2011.
Nittala, et al., "Bottom Up Fill in High Aspect Ratio Trenches," Novellus Systems, Inc., U.S. Appl. No. 13/313,735, filed Dec. 7, 2011.
Notice of Allowance for U.S. Appl. No. 12/625,468 mailed Jan. 31, 2012.
Allowed claims for U.S. Appl. No. 12/625,468 as of Jan. 31, 2012.

(56) References Cited

OTHER PUBLICATIONS

U.S. Final Office Action for U.S. Appl. No. 12/334,726 mailed Mar. 30, 2012.
U.S. Appl. No. 13/935,398, filed Jul. 3, 2013, entitled "Flowable Film Dielectric Gap Fill Process".
U.S. Appl. No. 13/607,511, filed Sep. 7, 2012, entitled "Flowable Oxide Deposition Using Rapid Delivery of Process Gases".
US Office Action, dated May 18, 2012, issued in U.S. Appl. No. 12/984,524.
US Final Office Action, dated Sep. 14, 2012, issued in U.S. Appl. No. 12/984,524.
US Notice of Allowance, dated Mar. 7, 2013, issued in U.S. Appl. No. 12/984,524.
US Notice of Allowance, dated Aug. 6, 2012, issued in U.S. Appl. No. 13/031,077.
US Notice of Allowance, dated Jul. 8, 2013, issued in U.S. Appl. No. 13/031,077.
US Final Office Action, dated Jun. 25, 2012, issued in U.S. Appl. No. 12/986,070.
US Final Office Action, dated Oct. 23, 2012, issued in U.S. Appl. No. 12/334,726.
US Notice of Allowance dated Jun. 10, 2013, issued in U.S. Appl. No. 12/334,726.
US Notice of Allowance, dated May 29, 2012, issued in U.S. Appl. No. 12/566,085.
US Notice of Allowance, dated Jun. 21, 2012, issued in U.S. Appl. No. 12/566,085.
US Office Action, dated Jun. 21, 2013, issued in U.S. Appl. No. 13/607,511.
US Final Office Action, dated Dec. 11, 2013, issued in U.S. Appl. No. 13/607,511.
US Office Action, dated Dec. 21, 2012, issued in U.S. Appl. No. 12/964,110.
US Final Office Action, dated Sep. 12, 2013, issued in U.S. Appl. No. 12/694,110.
US Office Action, dated Dec. 6, 2012, issued in U.S. Appl. No. 13/315,123.
US Office Action, dated Jul. 15, 2013, issued in U.S. Appl. No. 13/315,123.
US Notice of Allowance, dated Nov. 8, 2013, issued in U.S. Appl. No. 13/315,123.
US Office Action, dated Nov. 8, 2013, issued in U.S. Appl. No. 13/313,735.
US Office Action, dated Sep. 12, 2013, issued in U.S. Appl. No. 13/493,936.
Japanese Office Action dated Sep. 17, 2013 issued in JP2009-282737.
Siber, V. et al. (1994-1995) "Claiming Computer-Related articles of Manufacture," in Idea: The Journal of Law and Technology, pp. 13-35.
Chung, et al. (Mar. 2004) "Flowable Oxide CVD Process for Shallow Trench Isolation in Silicon Semiconductor," Journal of Semiconductor Technology and Science, 4(1):45-51.
Sakaue, H., et al. (1990) "Digital Chemical Vapor Deposition of SiO2 Using a Repetitive Reaction of Triethylsilane /Hydrogen and Oxidation," Department of Electrical Engineering, Hiroshima University, pp. L 124-L 127.
U.S. Appl. No. 14/249,272, filed Apr. 9, 2014, entitled "Methods and Apparatus for Dielectric Deposition."
US Office Action, dated Dec. 16, 2013, issued in U.S. Appl. No. 13/935,398.
US Notice of Allowance, dated Apr. 11, 2014, issued in U.S. Appl. No. 13/935,398.
US Notice of Allowance, dated Dec. 27, 2013, issued in U.S. Appl. No. 12/964,110.
US Notice of Allowance, dated Apr. 23, 2014, issued in U.S. Appl. No. 12/964,110.
US Final Office Action, dated Feb. 3, 2014, issued in U.S. Appl. No. 13/493,936.
US Notice of Allowance, dated May 22, 2014, issued in U.S. Appl. No. 13/493,936.
Japanese Office Action dated Jun. 3, 2014 issued in JP2009-282737.
PCT International Preliminary Report on Patentability and Written Opinion dated Jun. 21, 2012 issued in PCT/US2010/059721.
Chinese First Office Action dated Feb. 8, 2014 issued in CN 2010-80055670.3.
U.S. Appl. No. 14/464,071, filed Aug. 20, 2014, entitled "Flowable Dielectric for Selective Ultra Low-K Pore Sealing.".
US Office Action, dated Mar. 25, 2015, issued in U.S. Appl. No. 14/464,196.
US Office Action, dated Jul. 25, 2014, issued in U.S. Appl. No. 13/607,511.
US Notice of Allowance, dated Jan. 23, 2015, issued in U.S. Appl. No. 13/607,511.
US Final Office Action, dated Jul. 29, 2014, issued in U.S. Appl. No. 13/313,735.
US Office Action, dated Oct. 10, 2014, issued in U.S. Appl. No. 13/313,735.
US Office Action, dated Apr. 20, 2015, issued in U.S. Appl. No. 13/313,735.
US Office Action, dated Dec. 9, 2014, issued in U.S. Appl. No. 14/466,222.
US Final Office Action, dated Jul. 14, 2015, issued in U.S. Appl. No. 14/466,222.
Chinese Second Office Action dated Dec. 15, 2014 issued in CN 2010-80055670.3.
Chinese Third Office Action and Search Report dated Jun. 23, 2015 issued in CN 2010-80055670.3.
Taiwan Office Action [no translation] dated Jun. 12, 2015 issued in TW 099143081.
Chinese First Office Action and Search Report dated Dec. 18, 2014 issued in CN 201110424193.X.
Chinese First Office Action and Search Report dated Jan. 6, 2015 issued in CN 201110442926.2.
Bekiari, V. et al. (1998) "Characterization of Photoluminescence from a Material Made by Interaction of (3-Aminopropyl)triethoxysilane with Acetic Acid," *Langmuir*, 14(13):3459-3461.
Brankova et al. (2003) "Photoluminescence from Sol-Gel Organic/Inorganic Hybrid Gels Obtained through Carboxylic Acid Solvolysis," *Chem. Mater.*, 15(9):1855-1859.
Kessler et al., (2006) "New insight in the role of modifying ligands in the sol-gel processing of metal alkoxide precursors: A possibility to approach new classes of materials," J. Sol-Gel Sci. Techn. 40(2-3):163-179.
Stathatos et al. (Jul. 19, 2003) "Study of Acetic Acid-Catalyzed Nanocomposite Organic/Inorganic Ureasil Sol—Gel Ionic Conductors," Langmuir, 19:(18)7587—7591.

* cited by examiner

CVD FLOWABLE GAP FILL

CROSS-REFERENCE TO RELATED APPLICATIONS

This application is a continuation-in-part of and claims priority under 35 U.S.C. §120 to U.S. application Ser. No. 12/625,468, filed Nov. 24, 2009, which in turn is a continuation of Ser. No. 11/925,514, filed Oct. 26, 2007 (issued as U.S. Pat. No. 7,629,227), which claims benefit under 35 U.S.C. §119(e) to U.S. Provisional Application No. 60/856,193, filed Nov. 1, 2006. This application is also a continuation-in-part of and claims priority under 35 U.S.C. §120 to U.S. patent application Ser. No. 12/984,524, filed Jan. 4, 2011, which is a continuation of U.S. patent application Ser. No. 12/411,243, filed Mar. 25, 2009 (issued as U.S. Pat. No. 7,888,233), which is in turn a continuation of U.S. patent application Ser. No. 11/447,594, filed Jun. 5, 2006 (issued as U.S. Pat. No. 7,524,735) which is a continuation-in-part of U.S. patent application Ser. No. 10/810,066, filed Mar. 25, 2004, (issued as U.S. Pat. No. 7,074,690) and which is also a continuation-in-part of U.S. patent application Ser. No. 11/323,812, filed Dec. 29, 2005 (issued as U.S. Pat. No. 7,582,555). All of these applications are incorporated herein in their entireties by this reference.

BACKGROUND

This invention relates to electronic device fabrication processes. More specifically, the invention relates to chemical vapor deposition processes for forming dielectric layers in high aspect ratio, narrow width recessed features.

It is often necessary in semiconductor processing to fill or line a high aspect ratio gaps with insulating material. This is the case for shallow trench isolation, inter-metal dielectric layers, passivation layers, etc. As device geometries shrink and thermal budgets are reduced, void-free filling or uniform lining without significant necking of high aspect ratio spaces (e.g., AR>3:1) becomes increasingly difficult due to limitations of existing deposition processes.

Most deposition methods deposit more material on the upper region than on the lower region of a sidewall and/or create overhang formations at the entry of the gap. As a result the top part of a high aspect ratio structure sometimes closes prematurely leaving voids within the gap's lower portions. This problem is exacerbated in small features. Furthermore, as aspect ratios increase, the shape of the gap itself can contribute to the problem. High aspect ratio gaps often exhibit reentrant features, which make gap filling even more difficult. One such problematic reentrant feature is a narrowing at the top of the gap. The etched sidewalls slope inward near the top of the gap and for a given aspect ratio feature, this increases the ratio of gap volume to gap access area seen by the precursor species during deposition. Void and seam formation is more likely under these conditions. If the top of the gap prematurely closes off, a chemical etch is required to re-open the gap before more film can be deposited in the gap.

One approach to gap fill is high-density plasma chemical vapor deposition (HDP CVD). HDP CVD is a directional (bottom-up) CVD process that is used for high aspect ratio gap-fill. The method deposits more material at the bottom of a high aspect ratio structure than on its sidewalls. It accomplishes this by directing charged dielectric precursor species downward, to the bottom of the gap. Nevertheless, some overhang or top-hat formation still results at the entry region of the gap to be filled. This results from the non-directional deposition reactions of neutral species in the plasma reactor and from sputtering/redeposition processes. The directional aspect of the deposition process produces some high momentum charged species that sputter away bottom fill. The sputtered material tends to redeposit on the sidewalls. Limitations due to overhang formation become ever more severe as the width of the gap to be filled decreases and the aspect ratio increases.

HDP CVD processes rely on plasma etch steps to remove sidewall deposits and top-hats. Typically a fluorine species, such as $NF_3$, is used between dielectric film deposition steps to etch the film. After a layer of dielectric partially fills gaps on a substrate, the fluorine-containing plasma etches the layer to remove top-hats and open the gap for further deposition. However, these etch steps may be inappropriate in some applications.

Alternative dielectric deposition processes that can fill high aspect ratio features of narrow width, reduce sidewall and top-hat formation and eliminate or reduce the need for etch steps during dielectric deposition would be desirable.

SUMMARY

The present invention provides methods of filling gaps on a substrate by creating flowable silicon oxide-containing films. The methods involve introducing vapor-phase silicon-containing precursor and oxidant reactants into a reaction chamber containing the substrate under conditions such that a condensed flowable film is formed on the substrate. The flowable film at least partially fills gaps on the substrate. In certain embodiments, the methods involve using a catalyst in the formation of the film. The catalyst may be incorporated into one of the reactants and/or introduced as a separate reactant.

One aspect relates to a method of filling a gap on a substrate with a dielectric film involving introducing process gases including a silicon-containing precursor, an oxidant and a catalyst-containing compound to a reaction chamber housing the substrate and exposing the substrate to the process gas under conditions such that a condensed flowable film forms and at least partially fills the gap. In certain embodiments, the gases can further include an alcohol.

In some embodiments, the catalyst can be or include and acid or base. Forming a condensed flowable film can include an acid-catalyzed or base-catalyzed condensation process. Examples of catalysts can include $Cl^-$, $Br^-$ and $Fl^-$, substituted or unsubstituted onium cations, and proton-donors. According to various embodiments, a catalyst-containing compound can include be a silicon-containing compound and/or a halogen-containing compounds. According to various embodiments, a catalyst-containing compound can be pre-mixed with or incorporated into a silicon-containing precursor flow and/or an oxidant flow, or introduced to the reactor separately from the silicon-containing precursor and the oxidant.

These and other features are described further below.

DETAILED DESCRIPTION OF THE INVENTION

Introduction

The present invention relates to deposition processes that provide gap fill of high aspect ratio (typically at least 3:1), narrow width gaps (also referred to as features). Most deposition methods either deposit more material on the upper region than on the lower region of a sidewall or form cusps (also called top-hats) at the entry of the gap. To remove sidewall and top-hat deposits and keep the gap open for further deposition, conventional HDP CVD processes typically use a multi-cycle deposition process—etch process.

Figure 1:
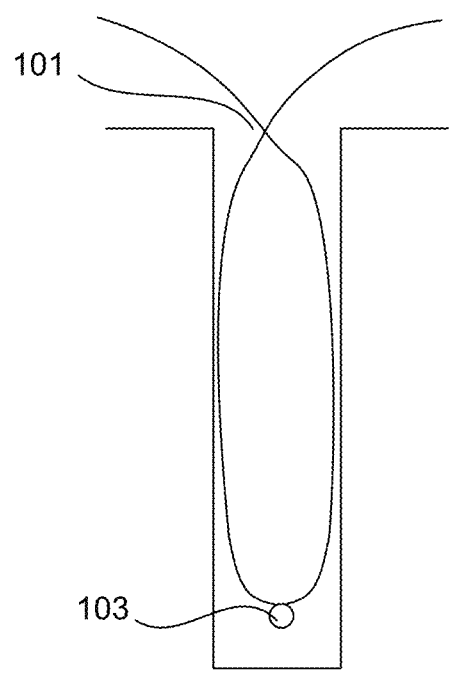
FIG. 1 is a rough schematic cross-sectional diagram of a trench partially filled by a conventional method.

FIG. 1 shows a rough schematic of a trench partially filled by a conventional deposition-only process. Reference number 101 indicates where sidewalls have formed from film that has been sputtered away from the bottom of the trench and redeposited on the sidewalls of the trench. These sidewalls have pinched off preventing further deposition. A chemical and/or sputter etch is required to re-open the trench before dielectric film can be deposited in it. Multiple deposition-etch-deposition cycles are necessary to fill high aspect ratio trenches or other features. Reference number 103 indicates a weak spot. Conventional gap fill methods often lead to the formation of weak spots in the dielectric film. Weak spots may form as a result of the increased gap volume to gap access area as the gap closes off, and can lead to voids or seams in the gap and ultimately device failure.

Conformal deposition processes, e.g., pulsed deposition layer (PDL) or atomic layer deposition (ALD), are able to fill gaps with vertical sidewalls. However, they may also result in voids or seams in gaps with reentrant features.

The present invention provides single-cycle and multi-cycle methods that result in good, seamless and void-free gap fill. The methods provide lined or partially or wholly filled gaps without overhang or top-hat formation. The methods described herein involve deposition of flowable dielectric films. While the description below refers chiefly to flowable silicon oxide films, the integration schemes described herein may also be used with other types of flowable dielectric films. For example, the film as-deposited may be primarily silicon nitride, with Si—N and N—H bonds.

As used herein, the term "flowable oxide film" is a flowable doped or undoped silicon oxide film having flow characteristics that provide consistent fill of a gap. The flowable oxide film may also be described as a soft jelly-like film, a gel having liquid flow characteristics, a liquid film, or a flowable film. In certain embodiments, forming a flowable film involves reacting a silicon-containing precursor and an oxidant to form a condensed flowable film on the substrate.

Formation of the film may be aided by a catalyst. The flowable oxide deposition methods described herein are not limited to a particular reaction mechanism, e.g., the reaction mechanism may involve an adsorption reaction, a hydrolysis reaction, a condensation reaction, a polymerization reaction, a vapor-phase reaction producing a vapor-phase product that condenses, condensation of one or more of the reactants prior to reaction, or a combination of these. The substrate is exposed to the process gases for a period sufficient to deposit a flowable film to fill at least some of the gap. The deposition process may form a soft jelly-like film with good flow characteristics, providing consistent fill. In certain embodiments, the flowable film is an organo-silicon film, e.g., an amorphous organo-silicon film. In other embodiments, the flowable oxide film may have substantially no organic material.

In certain embodiments, methods involve selectively condensing liquid in narrow gaps. The liquid can be a dielectric material or a precursor for a dielectric material to be deposited in a gap on a substrate. Under certain physical conditions the precursor liquid is either selectively deposited only in the narrow gaps or the "bulk" precursor liquid is removed by evaporation while the liquid in the narrow gaps remains condensed. Under certain physical conditions the liquid may condense at a greater rate in the narrow gaps, leading to a faster deposition rate or a greater film thickness in the narrow gaps. Regions of wider gaps and blanket or field regions would have a slower deposition rate and/or lower film thickness than the narrow gaps. By selectively depositing material in the narrow confined spaces of an integrated circuit, the process promotes bottom up fill.

Process

Figure 2:
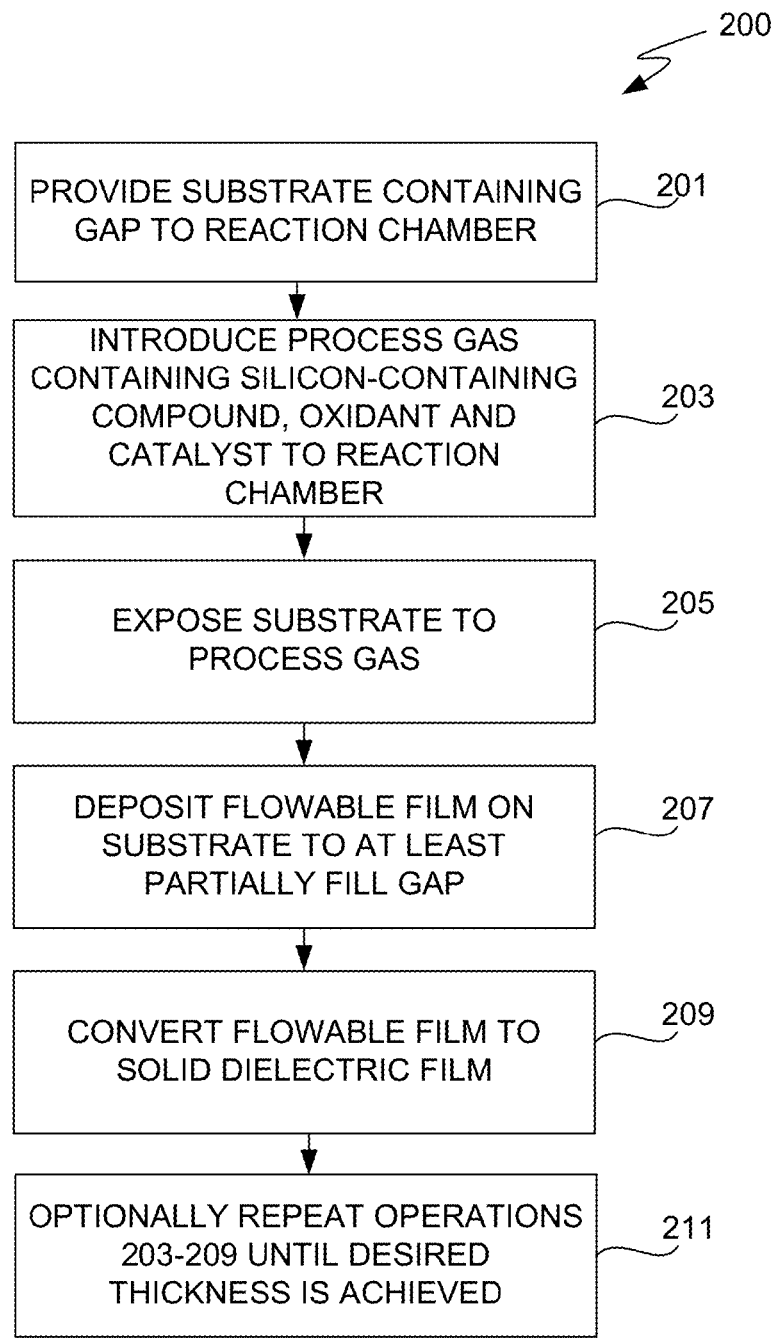
FIG. 2 is a process flow diagram depicting a method of filling a gap on a substrate according to certain embodiments.

FIG. 2 is a process flow sheet depicting a method according to one embodiment of the present invention. As shown, a deposition process 200 begins at an operation 201 in which a substrate containing a gap is provided to a reaction chamber. Providing the substrate to the reactor may involve clamping the substrate to a pedestal or other support in the chamber. For this purpose, an electrostatic, vacuum or mechanical chuck may be employed.

After the substrate is provided to the reaction chamber, process gases are introduced at an operation 203. The process gas components include a silicon-containing compound, an oxidant and a catalyst. The gases may also include one or more dopant precursors, e.g., a carbon, nitrogen, fluorine, phosphorous and/or boron-containing gas. Sometimes, though not necessarily, an inert carrier gas is present. In certain embodiments, the gases are introduced using a liquid injection system. In certain embodiments, the silicon-containing compound and the oxidant can be introduced via separate inlets or are combined just prior to introduction into the reactor in a mixing bowl and/or showerhead. As discussed further below, the catalyst and/or optional dopant may be incorporated into one of the reactants, pre-mixed with one of the reactants or introduced separately. An alcohol or other solvent may also be added to the process gas. The substrate is then exposed to the process gases at an operation 205. Conditions in the reactor are such that the silicon-containing compound and the oxidant react to form a condensed flowable film on the substrate. Formation of the film is aided by presence of the catalyst. The method is not limited to a particular reaction mechanism, e.g., the reaction mechanism may involve a condensation reaction, a vapor-phase reaction producing a vapor-phase product that condenses, condensation of one or more of the reactants prior to reaction, or a combination of these. As shown in an operation 207, a flowable film is thereby deposited on the substrate surface. The substrate is exposed to the process gases for a period sufficient to deposit a flowable film to fill at least some of the gap. The deposition process typically forms soft jelly-like film with good flow characteristics, providing consistent fill. The deposited film may also be described herein for the purposes of discussion as a gel having liquid flow characteristics, a liquid film or a flowable film.

Process conditions in the reactor are such that the reaction product condenses on the surface. In certain embodiments, this involves bringing the substrate into the chamber under "dark", i.e., non-plasma conditions, i.e., the substrate is not exposed to a plasma during the deposition phase (operations 205 and 207) of the process. In other embodiments, a plasma may be used. Although not indicated on the flow sheet, gaseous byproducts or excess reactants may be continuously pumped from the reaction chamber. Examples of deposition processes according to certain embodiments are described below with respect to FIGS. 3A, 3B and 4.

After the flowable film has been deposited on the substrate, the as-deposited flowable film is converted to a silicon oxide dielectric film in an operation 209. According to various embodiments, this conversion may involve a thermal, ultraviolet (UV), electron-beam (E-beam), microwave, laser or plasma anneal. Film conversion is discussed further below.

In certain embodiments, the gap may be filled or the desired amount of film may be formed in a single cycle. In other embodiments, the deposition and conversion processes are repeated as necessary to fill the gap or deposit the desired amount of film (e.g., line, partially fill, or wholly fill the gap). See block 211. Thickness of film deposited in a single cycle may range from about 10 nm to a complete fill and overburden and in particular examples from about 100 nm to 500 nm. In certain embodiments, it may be useful to use multiple cycles to more easily achieve gap fill, e.g., in narrow trenches, without gradients in density, film composition, dielectric constant, refractive index, and/or mechanical properties. These gradients may occur if the conversion process does not equally affect the film at all thicknesses.

In certain embodiments, the methods are characterized by bottom up, rather than conformal, fill of the gap. In certain embodiments, the methods exploiting the Kelvin effect. At scales <100 nm, the Kelvin effect is a significant contributor in determining phase equilibria in trenches, pores and high aspect ratio structures. If a liquid is in a confined space in contact with a surface which it wets, the liquid interface will have a curvature and a pressure differential will exist across the interface such that the pressure in the liquid is lower than the pressure in the vapor space above the interface. This will prevent the liquid from evaporating even though the ambient pressure is significantly lower than the saturation pressure. At conditions near saturation there can be selective condensation at the bottom of high aspect ratio structures due to the increased curvature of the film. Embodiments described herein take advantage of the propensity for liquids to condense preferentially and to remain condensed in small features. This propensity is employed to selectively fill narrow features with liquid. The resulting liquid, localized in small feature gaps is converted to the desired deposition material, typically a solid dielectric or metal. The invention makes use of the Kelvin effect in several different process sequences to achieve gap-fill in high aspect ratio features. The relevant thermodynamics of this process will be described in more detail below.

Figure 3A:
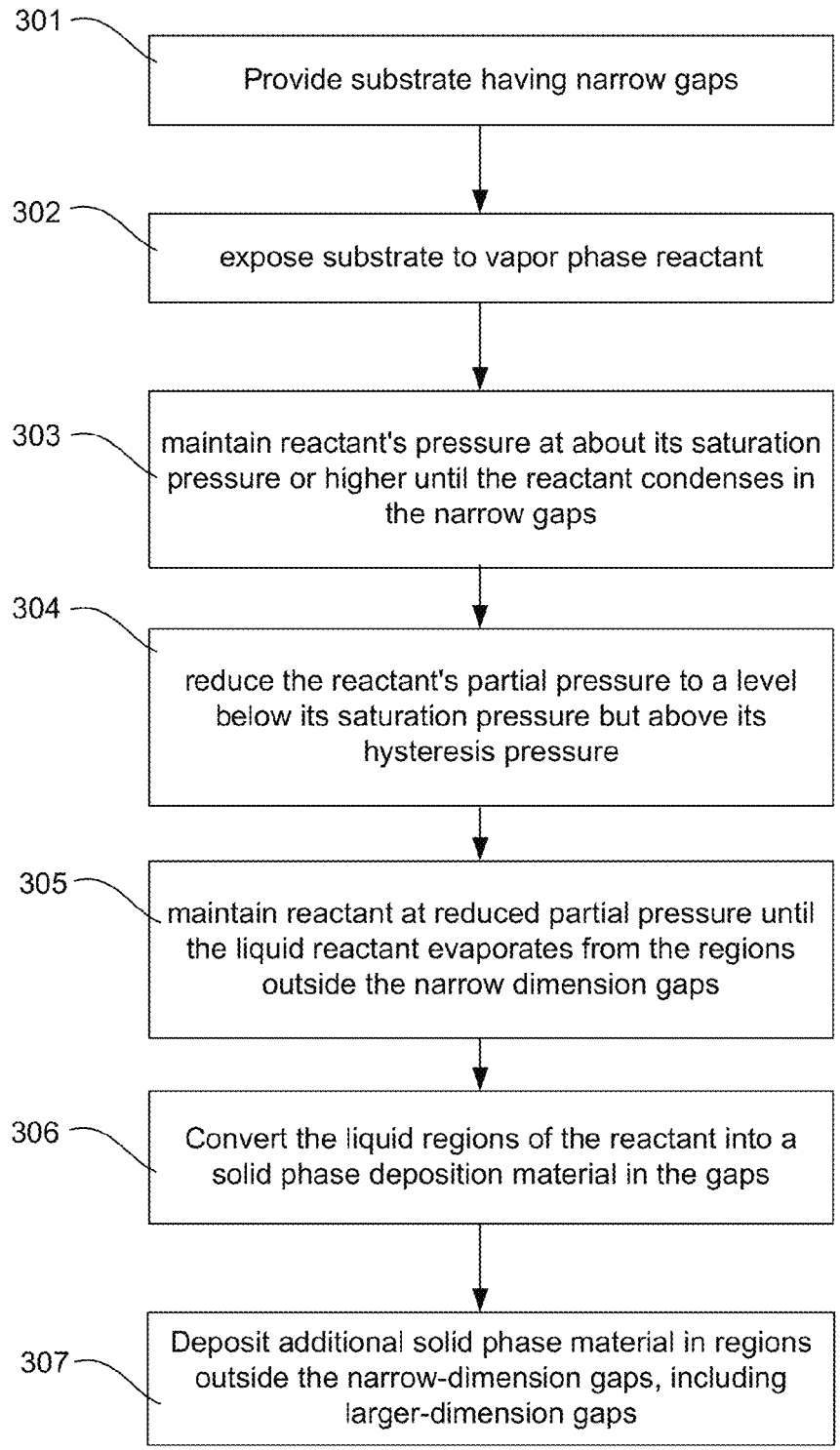
FIGS. 3a and 3b are process flow diagrams, each depicting a method according to certain embodiments.

One general process used to fill narrow-dimension gaps by selective condensation is illustrated in FIG. 3a. In an initial operation 301, a substrate having narrow gaps (e.g., openings on the order of about 100 nm or less) is provided. This operation can correspond to block 201 of FIG. 2. The substrate can be provided in a reaction chamber where the liquid reactants will be converted to a solid deposition layer. In some cases, however, the substrate may be initially provided in an environment that is not used for the actual deposition reaction. For many applications, the substrate is a partially fabricated integrated circuit or other electronic device. In such applications, the gaps may be defined by (a) trenches and vias for, e.g., shallow trench isolation, damascene line structures in dielectric layers, or storage capacitors, (b) gate electrodes in active devices, (c) vias for tungsten or copper interconnects, (d) metal lines after patterning, and the like.

In an operation 302, the substrate is exposed to a vapor phase reactant. Operation 302 can be performed as part of blocks 203-205 in the process of FIG. 2 in certain embodiments. Initially, one or more reactants, such as the silicon-containing precursor or oxidizer, may be provided at a partial pressure well below its saturation pressure. In this case, the reactant's partial pressure is then increased to about its saturation pressure or higher. This is not required, however, as the reactant may immediately have a partial pressure at or near its saturation pressure. Regardless of how the desired partial pressure (about saturation pressure) is reached, it is maintained there until the reactant condenses in the narrow gaps. See operation 303. Typically, additional condensate (referred to herein as "bulk liquid") forms on the substrate surface and larger dimension gaps as well. To remove this bulk liquid while retaining the entrained liquid in the narrow features, operation 304 reduces the reactant's partial pressure to a level below its saturation pressure but above its "hysteresis pressure." Hysteresis pressure is the minimum partial pressure at which liquid remains in gaps of a defined size (under equilibrium conditions). The hysteresis pressure is below the saturation pressure. Note that if the pressure is driven too low (below the hysteresis pressure), even the liquid in the narrow features will evaporate. The concept of a hysteresis pressure will be explained further below. Thus, in an operation 305, the reactant's partial pressure is maintained at the reduced level until the liquid evaporates from the regions outside the narrow-dimension gaps. The reactant's partial pressure can be modulated through control of the reactant flow rate, the diluent or co-reactant flow-rates or through the chamber pressure. While the partial pressure need not remain fixed during operation 305, it should reside within a window between the lower limit (the hysteresis pressure) and the saturation pressure. Alternatively, the partial pressure of the liquid reactant may also be brought below the saturation pressure by increasing the saturation pressure by heating the substrate or the chamber. In certain embodiments, operations 303-305 are performed as part of block 207 in the method of FIG. 2. In one embodiment, the silicon-containing precursor may be provided and condensed first before exposure to the oxidizer or other co-reactants. In another embodiment, the oxidizer may be provided and condensed first before exposure to the silicon containing precursor. In certain embodiments, both the precursor and oxidizer are provided substantially simultaneously. Other co-reactants, including catalysts or solvents, such as alcohol, may be provided initially or in subsequent steps.

With the liquid reactant(s) now selectively confined to narrow dimension gaps, it may be appropriate to take advantage of this localization to selectively form structures in the gaps. Thus, in an operation 306, the liquid regions of the reactant(s) are converted into a solid-phase deposition material. This conversion may be achieved physically for example simply by solidification or chemically by reacting the reactant liquid regions with another co-reactant to produce the solid material or by decomposing or polymerizing the reactant mixture using, for example, thermal or ultraviolet means. In certain embodiments, this operation can correspond to operation 209 of FIG. 2. Finally, in an optional operation 307, additional solid-phase material can be deposited in regions outside of the narrow-dimension gaps, including the larger dimension gaps that were not filled by the above process. This additional deposition may be accomplished using a conventional process such as CVD, physical vapor deposition (PVD), plasma assisted chemical vapor deposition (PECVD), high density plasma (HDP), spin on techniques, atomic layer deposition (ALD), pulsed nucleation layer (PNL) deposition, pulsed deposition layer (PDL), plating techniques (including electroplating and electroless plating), etc. Alternatively, it may be accomplished by making use of the Kelvin effect as described above, but with different precursors and/or co-reactants or under different partial pressures or with a different process sequence, etc. as appropriate for larger gap structures. In some embodiments, 301, 304, 305, 306, and 307 can be performed in the same manner as in reference to FIG. 3A, with block 302 and 303 omitted; between blocks 301 and 304, the substrate can be exposed to a liquid precursor (e.g. by dip casting, spray on, print on, or spin on methods).

Figure 3B:
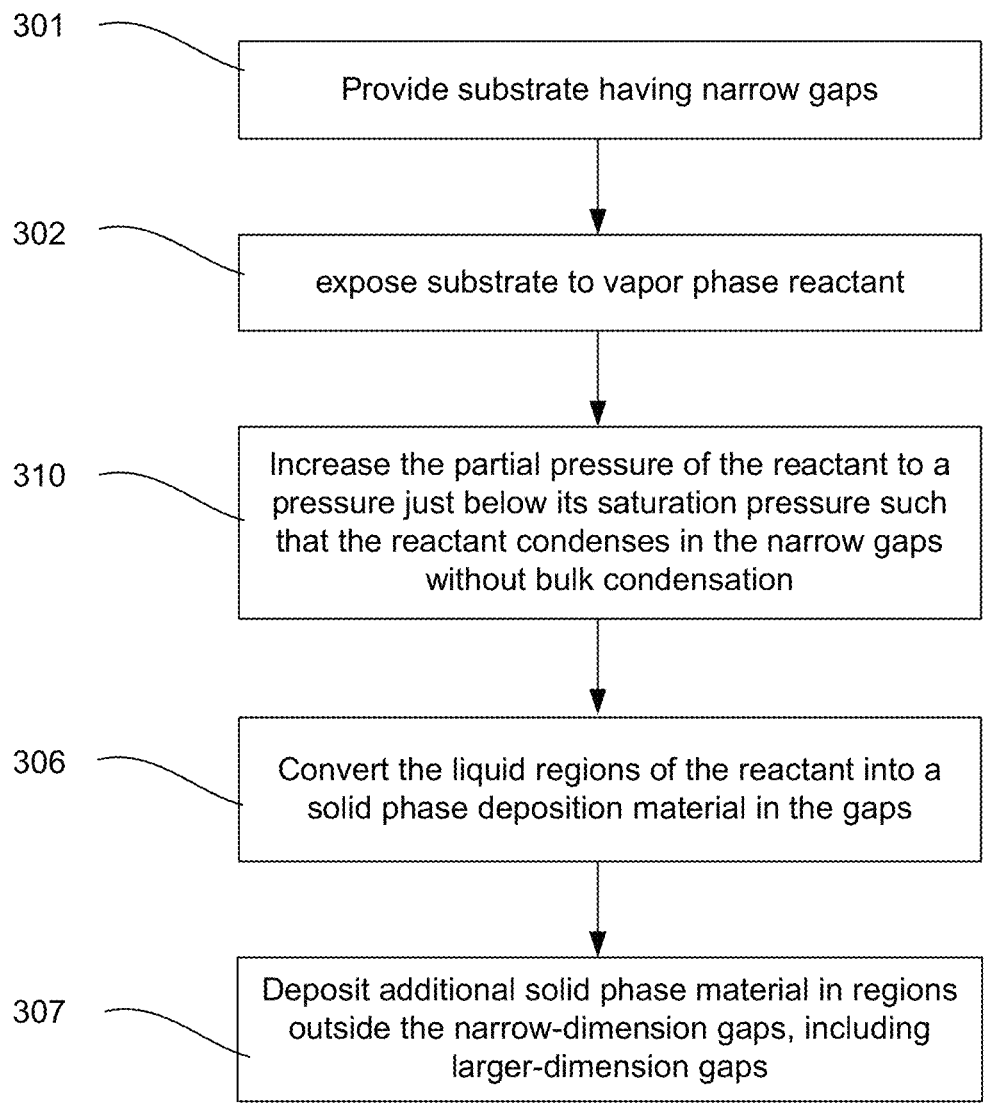

A second general process used to fill narrow-dimension gaps is illustrated in FIG. 3b. Operations 301, 302, 306 and 307 are described above in reference to FIG. 3a. Following 301 and 302 is operation 310, wherein the reactant's partial pressure is increased to a pressure just below its saturation pressure such that the reactant condenses in the narrow gaps without bulk condensation. Blocks 306 and 307 are then performed as described in reference to FIG. 3a. In certain embodiments, block 207 of FIG. 2 can involve operations 302, 330, and 306.

To illustrate the selective condensation due to the Kelvin effect, one can visualize what happens if a wafer with gap features less than 100 nm is brought in contact with a pure fluid (in vapor phase) at a temperature below its critical point and the fluid is pressurized to is saturation pressure and then depressurized as shown in FIGS. 4a-4e. These figures present cross-sections showing gaps typically encountered in shallow trench isolation applications. As shown, a pad nitride 405 (or other hard mask material) defines field regions 404 and trenches 406. In this example the trenches 406 are formed in a silicon substrate and assumed to have a width of not more than about 100 nanometers. The sidewalls of trenches 406 are lined with a nitride liner 408. Of course, other structures with gaps of similar dimensions will also exhibit the Kelvin effect as depicted in FIGS. 4a-4e. Structures of different shapes for examples vias or trenches or islands or structures with reentrant gaps or use of different liners will also exhibit the same qualitative behavior with some quantitative differences.

In FIG. 4a, the material in question is present entirely as a vapor phase fluid at a partial pressure much lower than saturation pressure. At this pressure, some of the material is adsorbed onto the surface of the substrate to form a minimal adsorption layer 410, with no liquid phase yet in existence. When the partial pressure of the fluid is raised to a point just below its saturation pressure, as shown in FIGS. 4b and 4c, the fluid starts to condense in the smaller features and in the corners of the larger features. This is due to the curvature of the adsorbent layer 410, which has characteristics of the liquid film. Note that, as the fluid starts to condense, the narrower features are filled first. See condensed fluid in regions 412. As shown in FIG. 4c, if the fluid's partial pressure is maintained in this range (at or near saturation pressure, but not significantly above saturation pressure), the vapor condenses in the narrow dimension trenches 406, but not elsewhere.

Figure 4:
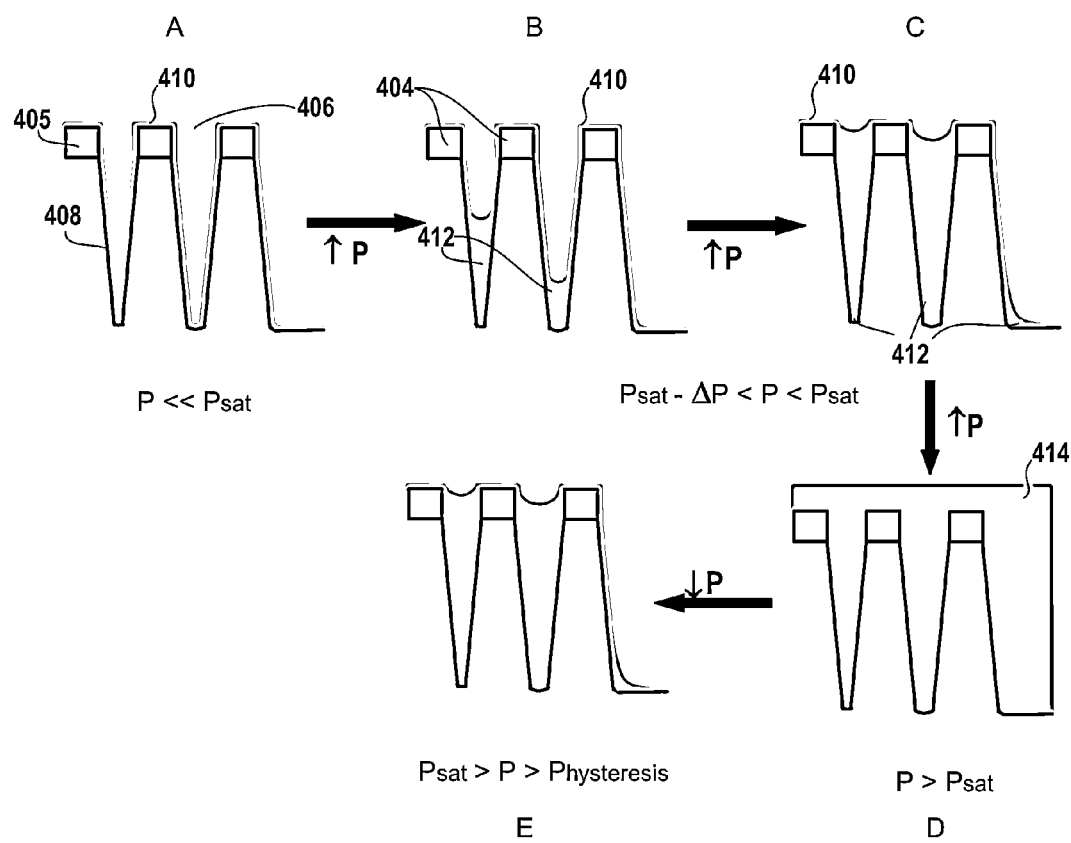
FIG. 4 illustrates a series of cross sections of a substrate with gap features of size less than 100 nm. The cross sections follow an example process of one implementation.

In FIG. 4d, the partial pressure of the fluid has been raised to a level above its saturation pressure, and fluid in the chamber condenses to a liquid state over the entire substrate. This includes large dimension gaps as well as field regions. The condensate in these regions is referred to as bulk liquid. See condensate 414 in FIG. 4d. Next, as shown in FIG. 4e, the chamber is slowly depressurized and the bulk fluid 414 vaporizes while the condensate 412 remains entrained in the smaller features. During the depressurization step, the curved interface is due to the condensed liquid in the features (rather than the absorbed film) and the curvature of this interface is much greater leading to a much larger Kelvin effect. This causes a hysteresis loop in pressurization-depressurization cycle. Note that in the features in FIG. 4, the neck dimension is larger than the rest of the feature. This process, however, is even more effective in instances where the neck dimension is smaller than or approximately equal to the rest of the feature. Thus, the Kelvin effect (and the range of applicability of the methods described herein) extends to reentrant features, features with faceted openings, straight features, sloped features, etc. This process provides for gap fill without voids, weak spots or seams as are often seen in directional or conformal gap fill processes. Also, gap fill by this method does not encounter forbidden gaps as is common with ALD type techniques where intermediate gap sizes are made inaccessible to bulk fill techniques.

Figure 5:
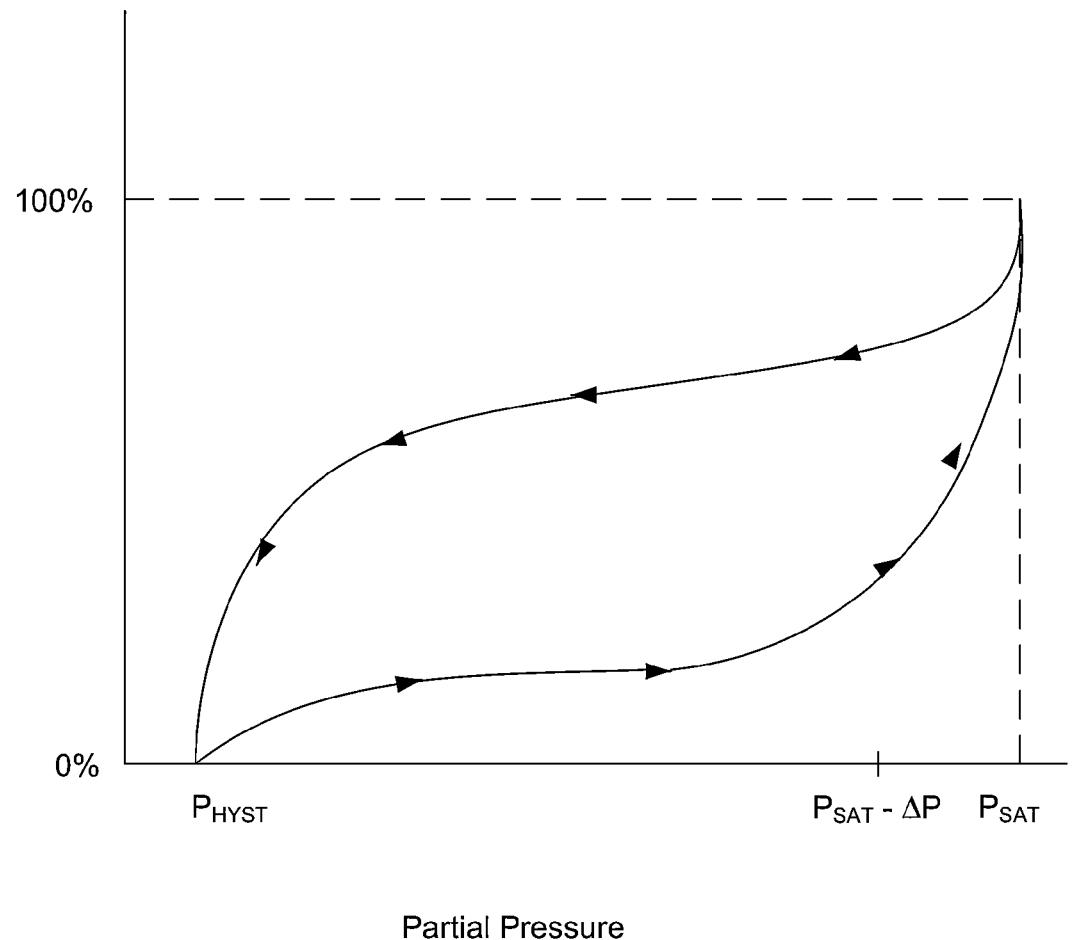
FIG. 5 illustrates the relationship between percent liquid phase (of a two phase component) and partial pressure of the component in small gap. The depicted hysteresis in the relationship results from the Kelvin effect.

FIG. 5 illustrates a generic hysteresis loop in a condensation-vaporization cycle due to the Kelvin effect in small-dimension features. The vertical axis has units of percentage of fluid in the liquid phase (100×mass of liquid/(mass of liquid+vapor)). The horizontal axis has units of partial pressure of the fluid. Initially, at very low pressure, the fluid is entirely in the gas phase (with some small quantity physically adsorbed on the surface). As the fluid's partial pressure approaches $P_{sat}$ at a pressure $P_{sat}-\Delta P$, condensate begins to form in the narrow dimension features and corners of larger features. The arrows on the graph indicate the direction of partial pressure change. As partial pressure is increased, formation of condensate is increased. Eventually, as pressure is raised to $P_{sat}$ and maintained at that pressure, 100% of the fluid will be in the liquid phase. In one embodiment of this invention where a pressurization-depressurization cycle is used, the direction of pressure change reverses so that fluid's partial pressure begins decreasing. Initially, some of the liquid begins vaporizing and the % liquid phase begins decreasing. The liquid depressurization curve may for a time follow the path of the pressurization curve as the bulk liquid and liquid in the large features evaporates. At some point, however, the small features will influence the process so that the Kelvin effect leads to an observed hysteresis, i.e., relatively more fluid will remain in the liquid phase for any given pressure (during depressurization). If there were no small dimension features, no hysteresis would be observed. As the partial pressure continues to decrease, it will cross below the pressure at which fluid first began to condense during pressurization. However, on the return path (depressurization), a significant amount of liquid remains entrained in the narrow dimension features and corners due to the presence of the curved vapor-liquid interface. Eventually, as the fluid's partial pressure continues to drop, even the liquid in the narrow features will evaporate. The point at which all fluid evaporates from narrow features during depressurization is referred to herein as the hysteresis pressure, $P_{hyst}$.

In one method of practice of this invention where single or multiple pressurization-depressurization cycles are employed, it is important to use a final partial pressure within a window between a lower limit (referred to herein as the hysteresis pressure, $P_{hyst}$) and the saturation pressure. By operating below the saturation pressure, most if not all of the bulk liquid should evaporate. By operating above the hysteresis pressure, at least some liquid will remain entrained in the narrow dimension features. The above explanation suggests an embodiment of this invention: initially the substrate is provided with bulk liquid and liquid in narrow dimension features, and then the pressure is decreased to a point between the hysteresis pressure and the saturation pressure and held there until the bulk liquid is removed and some liquid remains in the narrow dimension features. The initial wetting of the substrate may be accomplished in various ways including immersion, spraying, spin on techniques, etc. Of course, it may also be accomplished by exposure to vapor phase fluid at a partial pressure well above the fluid's saturation pressure. It can remain in this state until at least the narrow dimension features are filled with liquid. Typically, some amount of bulk liquid will also be formed.

The size of the hysteresis loop depends on the magnitude of the Kelvin effect and therefore on the feature size and shape as well as the surface tension of the liquid and can be calculated as the change in free energy due to evaporation of a differential volume ($\Delta V$) of liquid in the confined space which equals the change in surface area ($\Delta A$) times the surface tension as:

$$n\Delta G = -(\Delta V)\rho_{cond} RT \ln\left(\frac{f}{f_{sat}}\right) = (\Delta A)\gamma \cos\theta \quad [1]$$

where, $\gamma$ is the surface tension, $\theta$ is the contact angle, $\rho_{cond}$ is the density of the condensed phase fluid, $f$ and $f_{sat}$ are the fugacities at pressures P and $P_{sat}$.

For a trench on a wafer (assumed to be a rectangular one-dimensional trench with width d), equation 1 reduces to:

$$\left(\frac{f}{f_{sat}}\right) = \exp\left(-\frac{2\gamma\cos\theta}{\pi d \rho_{cond} RT}\right) \quad [2]$$

Similar equations can be derived for different feature shapes. For fluids at relatively low partial pressures, fugacity can be approximated by pressure. The main variables in applications of this invention include "d," the trench width and f, the fugacity associated with the hysteresis pressure, the maximum pressure at which some fluid remains entrained in trenches of width d during depressurization.

Figure 6:
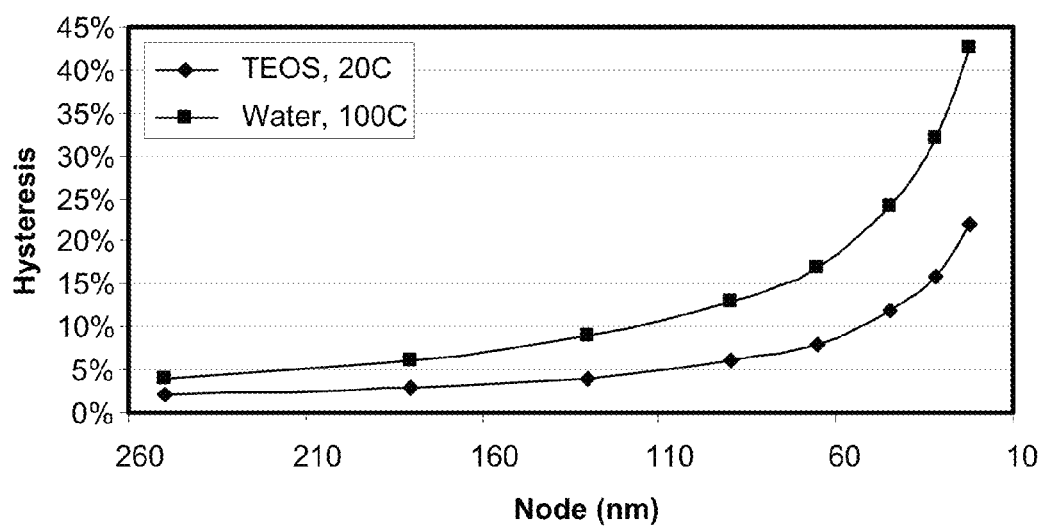
FIG. 6 shows how the magnitude of the hysteresis effect (due the Kelvin effect) varies as a function of feature size (as illustrated by the gap width for linear trenches) for water at 100° C. and TEOS at 20° C.

This phenomenon is exploited in this invention to allow for gap-fill in small features and trenches, which are essentially, confined spaces. As should be obvious by now, for a feature size of 45 nm, the fluid may exist as a liquid at pressures well below the saturation pressure. FIG. 6 shows the "size" of the hysteresis loop as calculated by equation 2 for water at 100° C. and TEOS at 20° C. in trenches as a function of feature size. On the vertical axis, percent hysteresis is calculated by using equation 3:

$$\% \text{ Hysteresis} = \frac{P_{Sat} - P_{Hyst}}{P_{sat}} \quad [3]$$

As the feature length scales shrink, this selective condensation effect becomes stronger, and provides a wider process window. In other words, at smaller dimensions, d, there is a wider range of operational partial pressures for which liquid will remain selectively entrained in narrow dimension features. The horizontal axis, which corresponds to dimension d, is the gap width associated with the technology node for IC fabrication. At the 180 nanometer gap width, the percent hysteresis is only relatively small for this example. Dropping to the 130 nanometer node and then the 70 nanometer node and beyond gives wider and wider process ranges. By way of providing a reference point, feature sizes in 2003 range from about 130 to 180 nm. A 28 nm node was in production by 2011. FIG. 6 illustrates the increased importance of the Kelvin effect as feature sizes become smaller. Thus, while the invention may be used profitably for substrates features having principal dimensions larger than 100 nanometers, it will find increasing benefit for substrates having features with even smaller principal dimensions, on the order of 80 nanometers, 50 nanometers, 50 nanometers, 28 nanometers, and beyond. The graph in FIG. 6 is an example; the magnitude of hysteresis for given feature sizes may vary for different liquids or at different temperatures.

Process Parameters

Process Gas

The process gases include a silicon-containing compound, an oxidant and, in certain embodiments, a catalyst. Suitable silicon-containing compounds include organo-silanes and organo-siloxanes. In certain embodiments, the silicon-containing compound is a commonly available liquid phase silicon source. In some embodiments, a silicon-containing compound having one or more mono, di, or tri-ethoxy, methoxy or butoxy functional groups is used. Examples include, but are not limited to, tetraoxymethylcyclotetrasiloxane (TOMCTS), octamethylcyclotetrasiloxane (OMCTS), tetraethoxysilane (TEOS), triethoxysilane (TES), trimethoxysilane (TMS or TriMOS), methyltriethoxyorthosilicate (MTEOS), tetramethylorthosilicate (TMOS), methyltrimethoxysilane (MT-MOS), methyltriethoxysilane (MTES), dimethyldimethoxysilane (DMDMOS), diethoxysilane (DES), triphenylethoxysilane, 1-(triethoxysilyl)-2-(diethoxymethylsilyl)ethane, tri-t-butoxylsilanol, tetramethoxy silane, trimethylmethoxysilane (TMMOS), dimethyldiethoxysilane (DMDEOS), a bridged siloxane such as bis-triethoxysilylethane (BTEOSE) or bis-triethoxysilylmethane (BTEOSM), tetramethylcyclotetrasiloxane (TMCTS), tetravinyltetramethylcyclotetrasiloxane (TVTMCTS) and mixtures of these precursors.

For processes involving the Kelvin effect, the precursor should have a saturation pressure that is reasonable for the range of temperatures and pressures available for the process under consideration. As indicated by equation 2, its liquid phase density, surface tension, and contact angle should be appropriate for providing a relatively large window of operation ($P_{sat} - P_{hyst}$).

In certain embodiments, the silicon-containing precursor is an alkoxysilane that may be described by the following:

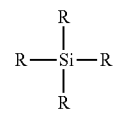

wherein at least 2 of the R groups are independently $C_1$-$C_5$ alkoxy groups (or other organic groups that can be readily cleaved from silicon at temperatures near room temperature by hydrolysis), and the balance, if any, are independently selected from the group consisting of hydrogen, alkyl, alkenyl and alkynyl groups, substituted and unsubstituted phenyl, halogen and amine. The alkoxy R groups include ethylene glycoxy, propylene glycoxy and the like. In particular embodiments, all four R groups are independently selected from methoxy, ethoxy, propoxy and butoxy, e.g., tetraethoxysilane (TEOS). Examples of other alkoxysilanes that are used in particular embodiments are trimethoxysilane $SiH(OMe)_3$, triacetoxysilane $SiH(OAc)_3$, tetraacetoxysilane $Si(OAc)_4$ methyltriethoxysilane $SiCH_3(OEt)_3$ and triethoxysilane $SiH(OEt)_3$. In other embodiments, the silicon-containing precursor may also contain Si—N bonds if a nitrogen-doped flowable film is desired. As described further below, the precursor in some embodiments, may be premixed with a catalyst, e.g., an halogenated alkoxysilane may be delivered with the precursor.

In certain embodiments, the precursor contains multiple alkylsilane or alkoxysilane groups that form linear, branched or cyclic organosilicon compounds. An example is:

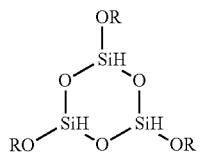

The oxidant may be any suitable oxidant capable of reacting with the silicon precursor to form the flowable film. Examples of suitable oxidants include ozone, hydrogen peroxide and water (steam). In certain embodiments, the oxidant is a non-peroxide oxidant. As described further below, the oxidant in some embodiments, may be premixed with a catalyst, e.g., an ammonia hydroxide solution may provide both the oxidant and the catalyst.

In some embodiments, the silicon-containing compound and the oxidant are delivered to the reaction chamber via liquid injection system that vaporizes the liquid for introduction to the chamber. The reactants can be delivered separately to the chamber or are combined just prior to introduction into the chamber in a mixing bowl and/or showerhead. Typical flow rates of the liquid introduced into a liquid injection system range from 0.01-10.0 mL/min per reactant. Optimal flow rates depend on the particular reactants, desired partial pressure, deposition rate, reaction rate and other process conditions. Acceptable silicon-containing compound/oxidant flow ratios are very variable with examples of suitable ratios including from about 10:1-1:100.

The flowable film deposited on the substrate typically contains some combination of Si—O, Si—H, Si—N, Si—ON, Si—C and Si—OH bonds. Precursor choice and process conditions may prevent significant incorporation of organic groups in the film if an undoped silicon dioxide is desired. For example, in reaction between TES and steam, the chemical reaction causes formation of a flowable film containing Si—OH, Si—H and Si—O bonds, while the ethoxy group is removed as a gaseous ethanol byproduct. The byproduct and/or excess reactants may be continuously pumped out.

Film composition depends in part on the oxidant chosen, with a weaker oxidant (e.g., water) resulting in more Si—H, Si—N or Si—C bonds than a stronger oxidant (e.g., ozone). Using ozone will result in conversion of most of the Si—H bonds to Si—OH bonds.

Water is used to form Si—O bonds in many embodiments. In particular embodiments, $H_2O$ (steam) or aqueous solutions are used as the oxidant. One reaction is the TES+$H_2O$. It is believed that the following reaction takes place to form the condensed Si—OH and Si—H containing film:

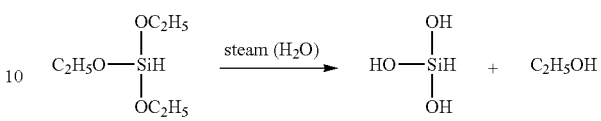

Although not indicated in the reaction scheme, a catalyst is used in many embodiments of the invention to aid in the formation of the condensed flowable film.

In a typical scenario, the precursor liquid may be reacted with another material to produce the desired solid material. For example, an acid or base catalyzed TEOS condensation process can be achieved selectively in small features by using a multi-step process in which the first reactant TEOS is first condensed inside the features by pressurizing TEOS vapor to pressures greater than $P_{hyst}$. The ambient fluid is a vapor while the features are filled with liquid TEOS. Then the second reactant (water/steam, ozone or peroxide) and catalyst (acid, e.g. HCl or base e.g. NH3) is added in such a manner that it preferentially partitions into the liquid phase where the reaction occurs to form a silicon dioxide.

In another scenario, the precursor liquid may be mixed with a catalyst (acid, e.g. chlorotriethoxysilane, chlorodiethoxysilane or methylchlorodiethoxysilane) is added in such a manner that it preferentially partitions into the liquid phase where the reaction occurs to form a silicon dioxide when reacted with a second reactant (water/steam, ozone or peroxide).

The same reaction can be carried out in a single step process, where both reactants are introduced into the chamber simultaneously and the pressure is slowly increased to a pressure just below the saturation pressure such that condensation and subsequent reaction occurs only in the target features. The reactant(s) may also be mixed in a carrier gas or diluent. Multiple pressure or temperature cycles can also be used to enhance mass transfer of reactants or byproducts.

Alternately, the precursor liquid may be converted into a solid material via decomposition of the precursor in the liquid regions. For example, thermal decomposition or ultraviolet processes may be used.

Catalyst

In many embodiments, the process gases include a catalyst that catalyzes the formation of the flowable film on the substrate. The catalytic compounds that are used in the methods of the invention are vaporizable and easily dissociate or ionize to form an ionic species that catalyzes the formation of the flowable film. Without being bound by a particular theory, it is believed that the anions or cations catalyze the formation of the flowable film by one or more of the following mechanisms: the catalyst wets the substrate surface, making it easier for the reactants or products to condense on or wet the surface; the catalyst changes the pH to one that favors hydrolysis and/or bond formation (e.g., crosslinking); the catalyst increases the reaction rate of chemical reactions (e.g., hydrolysis or condensation/polymerization); the catalyst affects the vapor-phase reaction; and the catalyst induces bond formation and/or cross-linking in the flowable film. According to various embodiments, the use of the catalyst aids film deposition, e.g., by improving crosslinking and reaction rate, and/or substrate coverage. Catalyst-free deposition has been observed in some cases to result in the formation of islands on the surface of the substrate, believed to be caused by the high mobility of reaction intermediates. In certain embodiments, the catalyst may aid full wafer coverage by increasing the rate of hydrolosis and thereby reducing the surface mobility of reaction intermediates. In other embodiments, catalyst-free deposition proceeds at too slow of a reaction rate to be commercially viable.

In certain embodiments, a proton donor catalyst is employed. Examples of proton donor catalysts include 1) acids including nitric, hydrofluoric, phosphoric, sulphuric, hydrochloric and bromic acids; 2) carboxylic acid derivatives including R—COOH and R—C(=O)X where R is substituted or unsubstituted alkyl, aryl, acetyl or phenol and X is a halide, as well as R—COOC—R carboxylic anhydrides; 3) $Si_xX_yH_z$ where x=1-2, y=1-3, z=1-3 and X is a halide; 4) $R_xSi—X_y$ where x=1-3 and y=1-3; R is alkyl, aloxy, aloxyalkane, aryl, acetyl or phenol; and X is a halide; and 5) ammonia and derivatives including ammonium hydroxide, hydrazine, hydroxylamine, and R—$NH_2$ where R is substituted or unsubstituted alkyl, aryl, acetyl, or phenol.

In addition to the examples of catalysts given above, halogen-containing compounds which may be used include halogenated molecules, including halogenated organic molecules, such as dichlorosilane ($SiCl_2H_2$), trichlorosilane ($SiCl_3H$), methylchlorosilane ($SiCH_3ClH_2$), chlorotriethoxysilane, chlorotrimethoxysilane, chloromethyldiethoxysilane, chloromethyldimethoxysilane, vinyltrichlorosilane, diethoxydichlorosilane, and hexachlorodisiloxane. Acids which may be used may be mineral acids such as hydrochloric acid (HCl), sulphuric acid ($H_2SO_4$), and phosphoric acid ($H_3PO_4$); organic acids such as formic acid (HCOOH), acetic acid ($CH_3COOH$), and trifluoroacetic acid ($CF_3COOH$). Bases which may be used include ammonia ($NH_3$) or ammonium hydroxide ($NH_4OH$), phosphine ($PH_3$); and other nitrogen- or phosphorus-containing organic compounds. Additional examples of catalysts are chloro-diethoxysilane, chloro-dimethoxysilane, methanesulfonic acid ($CH_3SO_3H$), trifluoromethanesulfonic acid ("triflic", $CF_3SO_3H$), chloro-dimethoxysilane, pyridine, acetyl chloride, chloroacetic acid ($CH_2ClCO_2H$), dichloroacetic acid ($CHCl_2CO_2H$), trichloroacetic acid ($CCl_2CO_2H$), oxalic acid ($HO_2CCO_2H$), benzoic acid ($C_6H_5CO_2H$), and triethylamine.

Catalysts that may be used in the methods of the invention can include nucleophiles, e.g., halogens ($F^-$, $Cl^-$ and $Br^-$, etc.) as well as oniums, e.g. ammonium ($NH_4^+$) and phosphonium ($PH_4^+$). Onium species that may be used include $NH_4OH$, $NH_4OAc$, $NH_3$, $(CH_3)_4NOH$, $(CH_3)_4NOAc$, $PH_3$, or any other compound that is vaporizable and readily disassociated or ionized to produce the desired ion.

In certain embodiments, the catalyst compound is a Si-containing catalyst compound, with the catalyst formed by in-situ hydrolysis that leads to the release of the active species. Si-containing catalyst compounds include $R_3SiX$ where the R groups are independently selected from H, $C_1$-$C_5$ alkyl or alkoxy and X is a halogen, amine, or phosphine. Specific examples include $(CH_3O)_3SiCl$, $(CH_3CH_2O)_3SiCl$, $(CH_3O)_2Si(H)Cl$, $(CH_3CH_2O)_2Si(H)Cl$ and $(CH_3)_3SiN(H)Si(CH_3)_3$. These Si-containing catalyst compounds may also provide at least some of the silicon that reacts to form the flowable film and/or be mixed with the silicon-containing precursor. For example, in one embodiment, a trimethoxysilane (($CH_3O)_3SiH$) precursor with a certain percentage of $Cl^-$ impurity (in the form of $(CH_3O)_2Si(H)Cl$) is used. A silicon-containing catalyst compound is not limited to use with its 'pure' form but may also be used with another silicon-containing precursor (e.g. $(CH_3O)_3SiCl$) may be the catalyst compound and TEOS the precursor). As indicated above, silicon-containing precursor and catalyst compounds may either introduced together or as separate reactants. Other silicon-containing compounds may also be used, including those of the form $HSiCl_3$ or $SiCl_4$.

As indicated above, the catalyst compound is not limited to silicon-containing compounds but can be any vaporizable compound that is readily dissociated or ionized to form a desired ionic species. In embodiments wherein the catalyst is a halogen ion, the catalyst may be introduced as chlorine gas, bromine gas, fluorine gas, hydrogen bromide, hydrogen chloride, etc., or other halogen-containing gas. As indicated above, various onium species are also used. These compounds are may be delivered to the reactor as a third reactant, or in certain embodiments, if the onium ion is inert to the silicon precursor in the absence of water, the onium catalyst may be pre-mixed with the silicon precursor. Likewise, the onium catalyst may be pre-mixed with water or other oxidant if it does not get de-activated.

The catalyst may be a metal ion or a non-metal ion. Examples of metal ions include sodium and potassium ions, while examples of non-metal ions are given above. Non-metal ions are preferred for semiconductor applications, but metal ions may be appropriate for other applications, such as in the manufacturing of flat-panel displays.

Also, as indicated, in certain embodiments, the catalyst is introduced with the oxidant, e.g., as an ammonium hydroxide solution. The catalyst compound may be introduced to the reactor via a separate inlet or are combined with one or more of the reactants just prior to introduction into the reactor, e.g, in a mixing bowl and/or showerhead.

According to various embodiments, catalysts and other reactants may be introduced simultaneously or in particular sequences. For example, in some embodiments, an acidic compound may be introduced into the reactor to catalyze the hydrolysis reaction at the beginning of the deposition process, then a basic compound may be introduced near the end of the hydrolysis step to inhibit the hydrolysis reaction and the catalyze the condensation reaction. Acids or bases may be introduced by normal delivery or by rapid delivery or "puffing" to catalyze or inhibit hydrolysis or condensation reaction quickly during the deposition process. Adjusting and altering the pH by puffing may occur at any time during the deposition process, and difference process timing and sequence may result in different films with properties desirable for different applications. Methods of rapid delivery that may be employed are described in U.S. application Ser. No. 12/566, 085, incorporated by reference herein.

Deposition Reaction Conditions

Reactions conditions are such that the silicon-containing compound and oxidant undergo a reaction to form a condensed flowable film on the substrate surface.

As discussed above, the reaction mechanism may involve a condensation reaction, a vapor-phase reaction producing a vapor-phase product that condenses, condensation of one or more of the reactants prior to reaction, or a combination of these. In certain embodiments, the reaction takes place in dark or non-plasma conditions.

Chamber pressure may be between about 1-100 Torr, in certain embodiments, it is between 2 and 50 Torr. Lower pressures typically result in slower deposition rates.

Substrate temperature is typically between about −20 and 100 C. In certain embodiments, temperature is between about −10 and 35 C. Pressure and temperature may be varied to adjust deposition time. In one embodiment, the temperature is about 5 C and the pressure about 10 Torr. In another embodiment, the temperature is about −5 C and the pressure about 20-40 Torr.

Exposure time depends on reaction conditions as well as the desired film thickness. Deposition rates are typically from about 100 angstroms/min to 1 micrometer/min.

Typically the silicon-containing compound and the oxidant are introduced via separate inlets or are combined just prior to introduction into the reactor. They may be delivered to the reactor through a showerhead, a dual-plenum showerhead, baffle plate, gas ring, injection tubes, or other means. Showerhead (or other gas inlet) to pedestal distance should also be small to facilitate deposition. Showerhead-pedestal distance typically ranges from about 100 mil-5 inches. In some embodiments, it ranges from about 200 mil-3 inches.

In addition, to pressure and temperature, reactant flow rates or diluents/carrier gas flow rates may be adjusted to vary deposition rate and film characteristics. Examples of precursor and oxidant flowrates are given above; as indicated a broad range of silicon-containing precursor:oxidant flow rate ratios typically may be used. The amount of catalyst used should be enough to adequately catalyze the reaction. In an example, an ammonia hydroxide solution (~0.05%) is used in place of water. In another example, the Cl⁻ content of a silicon-containing precursor is about 0.2 to 2.0 wt. %

Figure 7:
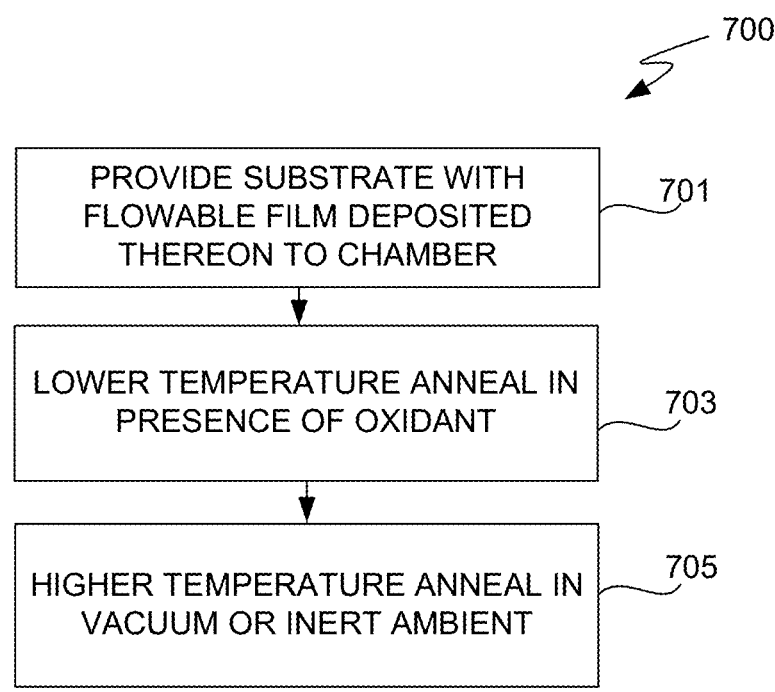
FIG. 7 is a process flow diagram depicting a method of converting a flowable film to a dense solid dielectric film according to one embodiment of the invention.

In certain embodiments, the chamber pressure is ramped up during the deposition. FIG. 7 shows chamber pressure 701, $H_2O$ flow 703, and trimethoxysilane (TriMOS) flow 705 as a function of time in an example of a deposition process. Chamber pressure is at about 4 Torr at the start of the deposition, and is gradually ramped up to about 50 Torr. Ramping up the pressure in a manner such as shown in FIG. 7 has been shown to provide improved deposition over using constant pressure in certain process schemes. If employed, pressure ramp-up rate typically ranges from about 2.5 Torrs/sec-10 Torr/sec in certain embodiments. In other process schemes, the chamber pressure is held constant during the deposition at 1-100 Torr, in specific cases between 2 and 50 Torr.

Converting the Flowable Film to a Solid Oxide Film

After the flowable film is deposited on the substrate, it is converted to a solid silicon dioxide film. According to various embodiments, the film may be converted to a solid oxide film by exposure to plasma, either a direct plasma or reactive species from a downstream plasma. It is desirable to achieve a uniform conversion of the flowable film to a solid silicon dioxide film.

Oxygen, helium, argon and steam plasmas are examples of plasmas that may be used. The plasma may also contain one or more of these compounds. Nitrogen-containing plasmas should be avoided if the incorporation of nitrogen in the resulting dielectric film is undesirable. Temperatures during plasma exposure are typically about 200 C or higher.

In certain embodiments, an oxygen or oxygen-containing plasma is used to facilitate conversion of the Si—H bonds into Si—O bonds. An oxygen-containing plasma may be particularly useful for flowable films that have a high number of Si—H bonds, e.g., for films formed by the reaction of TEOS and steam.

The plasma source may be any known plasma source, including RF and microwave sources. In an RF plasma, plasma power is typically at least about 500 W up to 5000 W or higher. The plasma source may be an inductively coupled (high density) plasma or a capacitively coupled plasma. The plasma source may also be a remote plasma or downstream plasma.

In some embodiments, a thermal anneal may be used instead of or in addition to a plasma to convert the film into a solid oxide. Thermal annealing may be performed in any suitable ambient, such as a water/steam, oxygen, air, carbon dioxide, hydrogen, nitrogen, ozone, or inert ambient. In specific embodiments, it is desirable to conduct the thermal anneal in an oxidizing ambient to facilitate conversion of the Si—H bonds or Si—OH bonds into Si—O bonds. In another embodiment, it is desirable to conduct the thermal anneal in an oxidizing ambient to facilitate conversion of Si—N bonds into Si—ON or Si—O bonds. Temperatures are typically at least about 250 C, i.e. high enough to break the Si—OH bond. For example, thermally annealing a silanol gel R—Si(OH)$_x$ results in a silicon dioxide $SiO_2$ film and water vapor.

In certain embodiments, a multi-stage curing or anneal process may be used. For example, a first stage may be used to convert any Si—H to Si—OH and Si—O or convert any Si—N to Si—ON and Si—O and a second stage used to improve film quality and convert the film to higher density oxide (substantially free of Si—N, Si—H and Si—OH). FIG. 7 shows a multi-stage anneal or cure process according to certain embodiments. The process 700 begins at an operation 701 in which the substrate having the flowable film containing Si—H and Si—OH bonds is provided to a chamber. The chamber may be the same chamber in which the deposition takes place (in which case the substrate remains there) or the substrate may be transferred to a separate chamber after the deposition for the conversion process. At an operation 701, the substrate is cured or annealed at a "lower" temperature in the presence of an oxidant. Lower refers to the temperature relative to the next anneal operation; in certain embodiments the lower temperature is less or equal to about 600 C, e.g., from about 200-600 C. This operation converts most of the Si—H and Si—OH to Si—O. Suitable oxidants include but are not limited to oxygen gas, steam, ozone and air. The use of the lower temperature anneal converts most of the Si—H of the flowable film to Si—O, but does not allow oxidation of the silicon substrate. Then, in an operation 705, the film is annealed or cured at higher temperature in a vacuum or inert (e.g., nitrogen, argon, helium) or mildly oxidizing ambient to convert any remaining Si—OH bonds to Si—O, improve film quality and convert the film to a fully dense oxide. Temperatures for this operation are higher than the lower temperature in operation 703, and are typically less than or equal to about 1100 C (e.g, between about 400 and 1100 C). The use of the multi-stage anneal described above results in gap fill free of density or composition gradients.

Other Embodiments

Commonly-assigned U.S. patent application Ser. No. 11/323,812 (hereby incorporated by reference for all purposes) describes a method of forming a flowable film by first depositing the silicon-containing precursor and then flowing steam to convert the film to the flowable liquid. The use of a catalyst as described herein may be used in conjunction with this method, with the catalyst introduced in one of the reactant flows, or as a separate reactant that may be introduced at the same time as either or both reactants.

Further, while the above description discusses the invention in the context of integrated circuit fabrication, there are numerous applications of the present invention, both inside and outside the integrated circuit fabrication arena.

Apparatus

The methods of the present invention may be performed on a wide-range of reaction chambers. The methods may be implemented on any chamber equipped for deposition of dielectric film, including HDP-CVD reactors, PECVD reactors, SACVD reactors, ALD reactors, any chamber equipped for CVD reactions, and chambers used for PDL (pulsed deposition layers).

Such a reactor may take many different forms. Generally, the apparatus will include one or more chambers or "reactors" (sometimes including multiple stations) that house one or more wafers and are suitable for wafer processing. Each chamber may house one or more wafers for processing. The one or more chambers maintain the wafer in a defined position or positions (with or without motion within that position, e.g. rotation, vertical translation, vibration, or other agitation). While in process, each wafer is held in place by a pedestal, electrostatic chuck, mechanical chuck and/or other wafer holding apparatus. For certain operations in which the wafer is to be heated, the apparatus may include a heater such as a heating plate. For certain operations in which the wafer is to be cooled, the apparatus may include a cool plate or a chiller.

In certain embodiments, the present invention may be implemented in a HDP CVD reactor. An example of a suitable reactor is the Speed™ reactor, available from Novellus Systems of San Jose, Calif. In certain embodiments, the present invention may be implemented in a PECVD reactor. Examples of suitable reactors are the Sequel™ reactor and the Vector™ reactor, both available from Novellus Systems of San Jose, Calif. In certain embodiments, the present invention may be implemented in a CVD chamber equipped for metal and/or dielectric deposition. An example of a suitable reactor is the Altus™ reactor available from Novellus Systems of San Jose, Calif. In certain embodiments, the present invention may be implemented in a chamber equipped for atomic layer deposition (ALD), pulsed deposition layer (PDL), or pulsed nucleation layer (PNL) reactions. Examples of such reactors are the Altus DirectFill™ reactor and the PDL Oxide reactor, both available from Novellus Systems of San Jose, Calif.

In certain embodiments, the deposition and conversion operations are performed in the same reaction chamber. In other embodiments, the deposition and conversion operations are performed on different stations in the same reaction chamber. In other embodiments, the deposition may be performed in a first chamber and then transferred to a second chamber for a thermal, plasma or other type of anneal. For example, reactors that are configured for plasma reactions may be used for both the deposition and plasma anneal operations. Other reactors may be used for deposition and thermal anneal operations.

Figure 8:
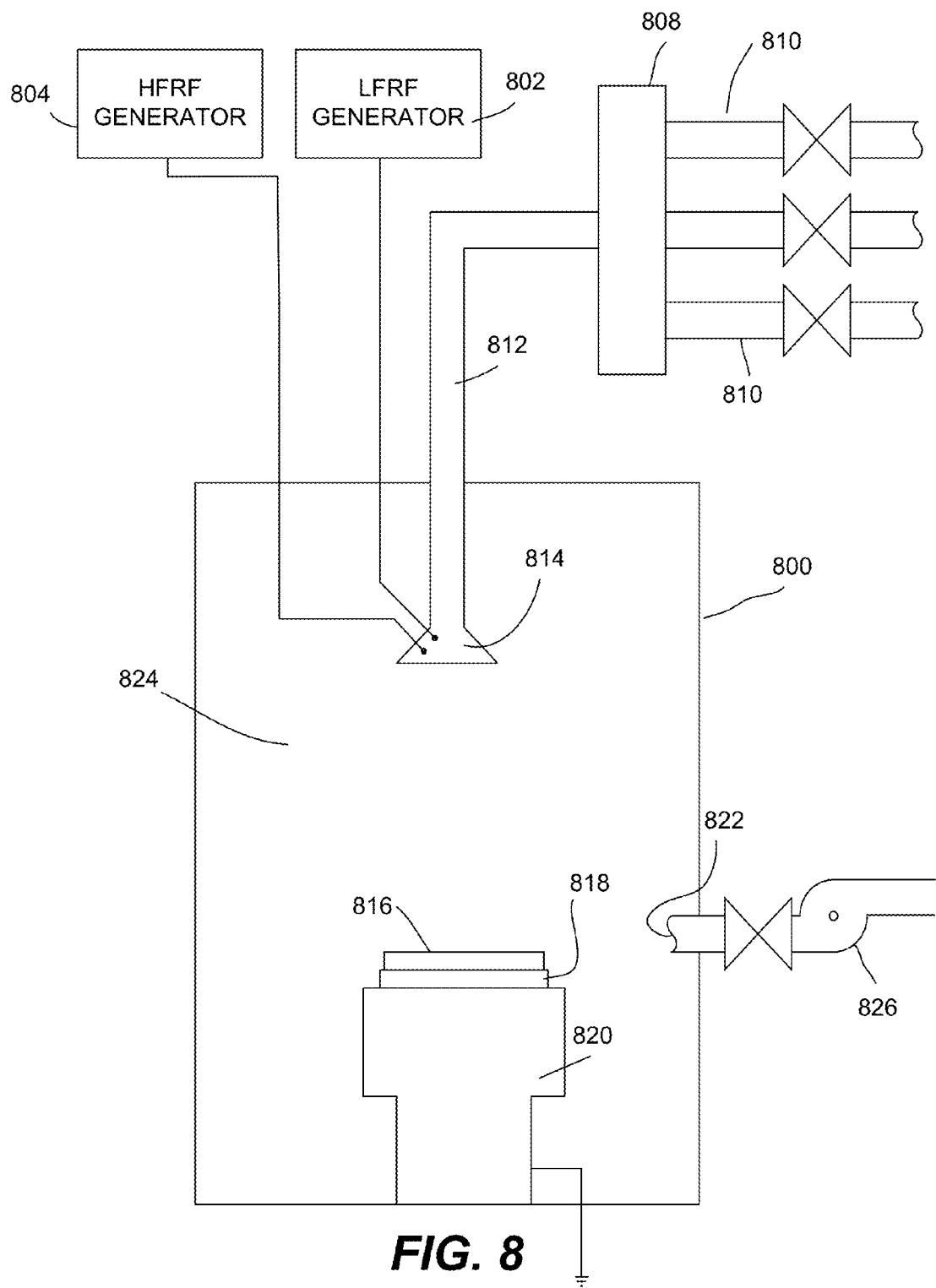
FIGS. 8 and 9 are block diagram depicting some components of various reactors suitable for performing certain embodiments of the invention.

FIG. 8 shows an example of a reactor that may be used in accordance with certain embodiments of the invention. The reactor shown in FIG. 8 is suitable for both the deposition and conversion to a solid film, for example, by plasma anneal. As shown, a reactor 800 includes a process chamber 824, which encloses other components of the reactor and serves to contain the plasma generated by a capacitor type system including a showerhead 814 working in conjunction with a grounded heater block 820. A low-frequency RF generator 802 and a high-frequency RF generator 804 are connected to showerhead 814. In another embodiment, the RF generator(s) may be connected to the pedestal and the showerhead may be grounded. The power and frequency are sufficient to generate a plasma from the process gas, for example, 100-2000 W total energy for a deposition, and a higher power for a plasma anneal. In one implementation of the present invention, the generators are not used during deposition of the flowable film. During the plasma anneal step, one or both generators may be used. For example, in a typical process, the high frequency RF component is generally between 2-60 MHz; in a preferred embodiment, the component is 13.56 MHz.

Within the reactor, a wafer pedestal 818 supports a substrate 816. The pedestal typically includes a chuck, a fork, or lift pins to hold and transfer the substrate during and between the deposition and/or plasma treatment reactions. The chuck may be an electrostatic chuck, a mechanical chuck or various other types of chuck as are available for use in the industry and/or research.

The process gases are introduced via inlet 812. Multiple source gas lines 810 are connected to manifold 808. The gases may be completely premixed, partially premixed or not. Appropriate valving and mass flow control mechanisms are employed to ensure that the correct gases are delivered during the deposition and plasma treatment phases of the process. In case the chemical precursor(s) is delivered in the liquid form, liquid flow control and injection mechanisms are employed. The liquid is then vaporized and mixed with other process gases during its transportation in a manifold heated above its vaporization point before reaching the deposition chamber. The temperature of the mixing bowl/manifold lines should be maintained at levels above the vaporization temperature of the process gases. Temperatures at or above about 80 C at pressures at or less than about 20 Torr usually suffice.

Process gases exit chamber 800 via an outlet 822. A vacuum pump 826 (e.g., a one or two stage mechanical dry pump and/or a turbomolecular pump) typically draws process gases out and maintains a suitably low pressure within the reactor by a close loop controlled flow restriction device, such as a throttle valve or a pendulum valve.

It should be noted that the apparatus depicted in FIG. 8 is but one example of an apparatus that may be used to implement this invention.

Figure 9:
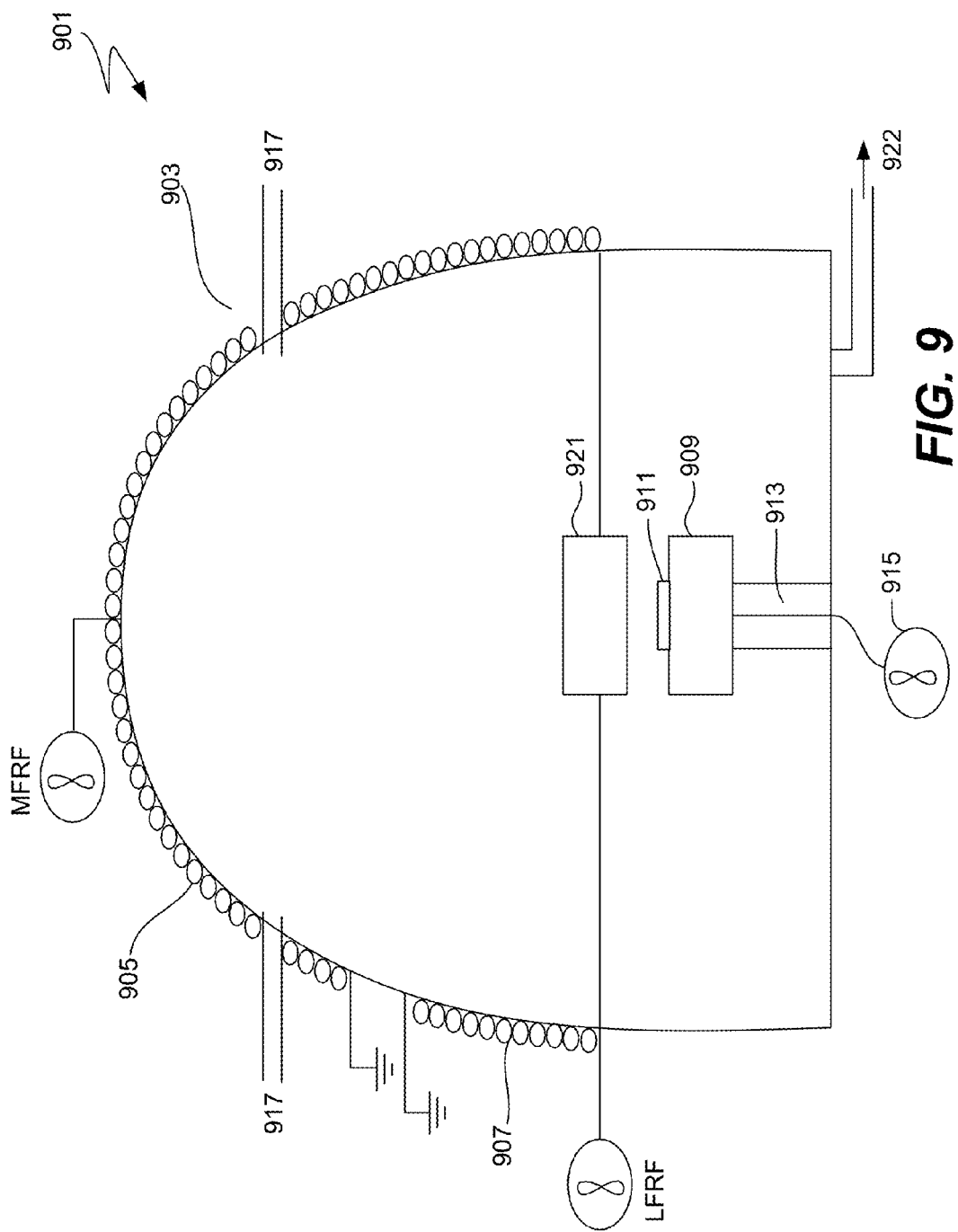

FIG. 9 provides a simple block diagram depicting various reactor components as may be arranged in a HDP-CVD reactor that may be used in accordance with the invention. As shown, a reactor 901 includes a process chamber 903 which encloses other components of the reactor and serves to contain the plasma. In one example, the process chamber walls are made from aluminum, aluminum oxide, and/or other suitable material. The embodiment shown in FIG. 9 has two plasma sources: top RF coil 905 and side RF coil 907. Top RF coil 905 is a medium frequency or MFRF coil and side RF coil 907 is a low frequency or LFRF coil. In the embodiment shown in FIG. 9, MFRF frequency may be from 430-470 kHz and LFRF frequency from 340-370 kHz. However, the invention is not limited to operation in reaction chambers with dual sources, nor RF plasma sources. Any suitable plasma source or sources may be used.

Within the reactor, a wafer pedestal 909 supports a substrate 911. The pedestal typically includes a chuck (sometimes referred to as a clamp) to hold the substrate in place during the deposition reaction. The chuck may be an electrostatic chuck, a mechanical chuck or various other types of chuck as are available for use in the industry and/or research. A heat transfer subsystem including a line 913 for supplying heat transfer fluid controls the temperature of substrate 911. The wafer chuck and heat transfer fluid system can facilitate maintaining the appropriate wafer temperatures.

A high frequency RF of HFRF source 915 serves to electrically bias substrate 911 and draw charged precursor species onto the substrate for the deposition reaction. Electrical energy from source 915 is coupled to substrate 911 via an electrode or capacitive coupling, for example. Note that the bias applied to the substrate need not be an RF bias. Other frequencies and DC bias may be used as well.

The process gases are introduced via one or more inlets 917. The gases may be premixed or not. Preferably, the process gas is introduced through a gas supply inlet mechanism including orifices. In some embodiments, at least some of the orifices orient the process gas along an axis of injection intersecting an exposed surface of the substrate at an acute angle. Further, the gas or gas mixtures may be introduced from a primary gas ring 921, which may or may not direct the gases toward the substrate surface. Injectors may be connected to the primary gas ring 921 to direct at least some of the gases or gas mixtures into the chamber and toward substrate. Note that injectors, gas rings or other mechanisms for directing process gas toward the wafer are not critical to this invention. The flow dynamics caused by a process gas entering the chamber will itself cause the gas to disperse in all directions—including toward the substrate. Process gases exit chamber 903 via an outlet 922. A vacuum pump (e.g., a turbomolecular pump) typically draws process gases out and maintains a suitable pressure within the reactor.

In certain embodiments, high-cost features of the Speed™ or other HDP-CVD tool may be eliminated. For example, the present invention may be implemented on a HDP-CVD reactor without a dome and/or turbo-molecular pumps.

As indicated the reactors depicted in FIGS. 8 and 9 are merely examples. For example, while FIGS. 8 and 9 provide examples of reactors that may be used to deposit the flowable film and provide inductively or capacitatively coupled plasma for an anneal operation, in certain embodiments wherein non-plasma thermal anneals are performed, the plasma generation mechanisms are not necessary. Also, as described above, the reactants are injected via liquid injectors in many embodiments. In certain embodiments, the CVD reactor may include a baffle assembly to increase reactor residence time and provides uniform delivery of the gases. An example of a baffle plate assembly as used in accordance with the invention is described the above-referenced commonly-assigned U.S. patent application Ser. No. 11/323,812. Additional description of apparatus suitable for accomplishing the methods described herein is in U.S. patent application Ser. No. 13/329,078, incorporated by reference herein.

Another aspect of the invention is an apparatus configured to accomplish the methods described herein. A suitable apparatus includes hardware for accomplishing the process operations, described above, and a system controller having instructions for controlling process operations in accordance with the present invention. The system controller will typically include one or more memory devices and one or more processors configured to execute the instructions so that the apparatus will perform a method in accordance with the present invention. Machine-readable media containing instructions, such as non-transitory machine-readable media, for controlling process operations in accordance with the present invention may be coupled to the system controller.

The apparatus/process described hereinabove may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically comprises some or all of the following steps, each step enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

EXPERIMENTAL

The following examples provide details illustrating aspects of the present invention. These examples are provided to exemplify and more clearly illustrate these aspects of the invention and are in no way intended to be limiting.

Example 1

Effect of Using Cl⁻ Catalyst

Wafers were exposed to trimethoxysilane (TriMOS) gas and steam at the following conditions:

|  | A | B |
|---|---|---|
| Catalyst Content | 0 | 0.4% Cl (provided as $(CH_3O)_2Si(H)Cl$) |
| TriMOS flow rate | 1.3 mL/min | 1.3 mL/min |
| Steam flow rate | 0.13 mL/min | 0.13 mL/min |
| Pressure | 4-50 torr | 4-50 torr |
| Temperature | 8 C. | 8 C. |
| Exposure Time | 20-60 sec | 20-60 sec |

The wafer was allowed to cool to 8° C. with a constant flow of He at 2 SLM before exposing to steam (1.00 mL/min) over a period of 10 s. The wafer is then exposed to TriMOS (1.30 mL/min) and steam (0.13 mL/min) for a period of 45 s during which time the He-carrier gas was flowing at 2 SLM. Pressures were varied during the process.

No deposition was observed for "A." For "B," full, continuous-color wafer coverage of film was observed. Film thickness was observed to be fairly uniform, with most of the wafer having about 100 nm of film.

Example 2

Effect of Thermal Cure Budget on Film Structure

Figure 10:
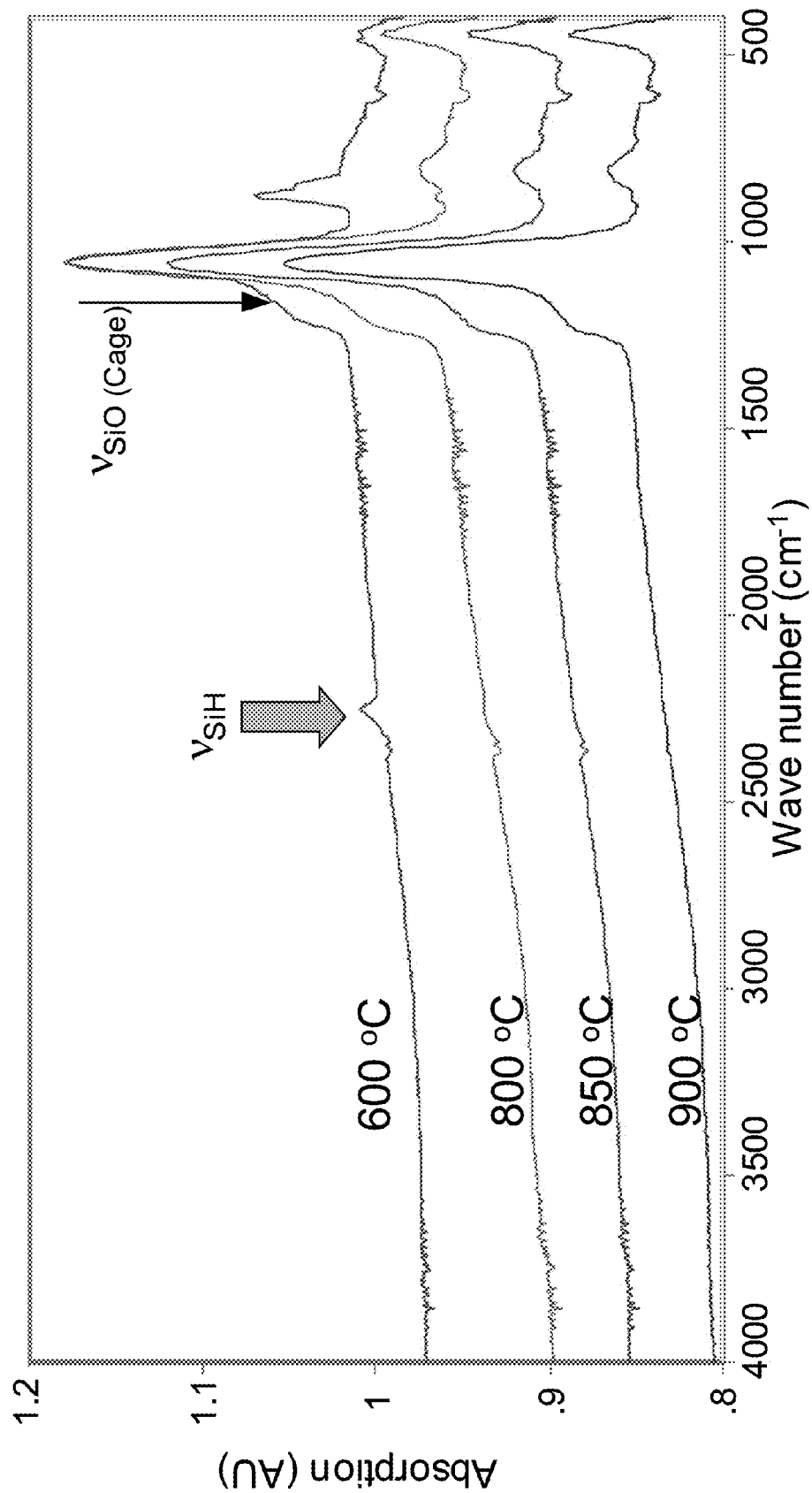
FIG. 10 is FTIR spectra comparing the composition of dielectric films formed by methods of the present invention using various anneal temperatures.

FIG. 10 shows FTIR spectra of dielectric films formed by deposition of flowable films and subsequent thermal cure. Spectra of films cured at 600 C, 800 C, 850 C and 900 C for 60 min are shown. Si—H and cage-like Si—O peaks are indicated on the figure. As can be seen, a small Si—H peak is present at 600 C. Higher temperatures (at or above about 850 C) lead to a complete conversion of Si—H to Si—O. The higher temperature cure also leads to transformation of the cage-like Si—O to branch-like structures, which results in a thermal oxide like films.

Example 3

Multi-Stage Anneal

A single stage 60 min anneal (600 C in air) was compared to multi-stage (60 min/600 C in air followed by 900 C vacuum) anneal. The film resulting from the multi-stage cure was observed to be more etch resistant towards 6:1 BOE (buffered HF etching) solution. In general, the denser the film is, the lower the film wet etch rate (WER) is. Typically, a small wafer with the film is immersed in the 6:1 BOE solution for a period of 10 seconds. The differences in film thickness (measured by any available Opti-probe or ellipsometry techniques) divided by the wet etch time (10 sec) provides the wet etch rate (WER) of a given film in the 6:1 BOE solution. A small piece of the single stage cured (600° C. in air) film subjected to immersion in 6:1 BOE for 10 s exhibited a WER of 306 nm/min whereas the multi-stage cured sample (600° C. in air followed by 900° C. in vacuum) exhibited a much slower WER of 230 nm/min film. This indicates that the multi-stage anneal results in denser films.

Example 4

Example Deposition Process

Figure 11:
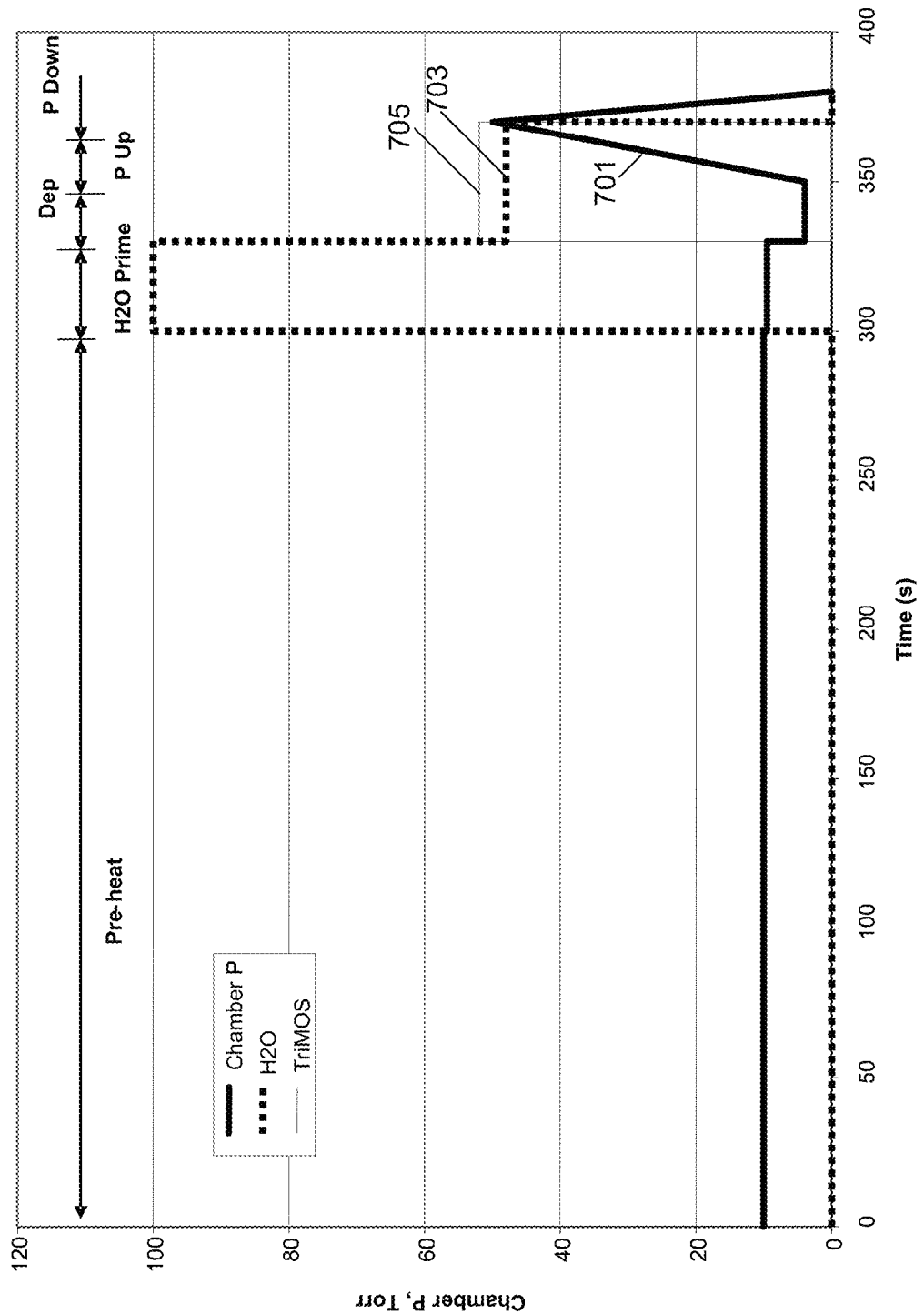
FIG. 11 is graph depicting pressure and silicon precursor and oxidant flow rates as a function of time in a deposition process in accordance with certain embodiments of the invention.

FIG. 11 shows an example of a deposition process. The operations shown in the example process of FIG. 11 include a pre-heat/helium soak at 10 Torr from 15-300 seconds. The wafer then undergoes a steam soak at 9.5 Torr for 30 seconds. $H_2O$ flow is then reduced and TriMos introduced to begin deposition at 4 Torr. Pressure remains at 4 Torr for 20 seconds, before ramping up to 50 Torr. Deposition continues for about another 20 seconds, at which point the gas flows are stopped and the chamber is pumped down for wafer transfer.

While this invention has been described in terms of a few preferred embodiments, it should not be limited to the specifics presented above. Many variations on the above-described preferred embodiments, may be employed. Therefore, the invention should be broadly interpreted with reference to the following claims.

The invention claimed is:

1. A method of filling a gap on a substrate with a dielectric film comprising:
    introducing process gases comprising a silicon-containing precursor, an oxidant and a catalyst-containing compound to a reaction chamber housing the substrate;
    exposing the substrate to the process gas under conditions such that a condensed flowable film forms and at least partially fills the gap,
    wherein the method comprises an acid-catalyzed condensation.

2. The method of claim 1, wherein the process gases comprise an alcohol.

3. The method of claim 1, wherein the catalyst is selected from $Cl^-$, $Br^-$ and $Fl^-$.

4. The method of claim 1, wherein the catalyst-containing compound is a silicon-containing compound.

5. The method of claim 1, wherein a silicon-containing precursor flow and an oxidant flow are introduced into the chamber via separate inlets.

6. The method of claim 1, wherein the catalyst-containing compound is pre-mixed or incorporated into a silicon-containing precursor flow and/or an oxidant flow.

7. The method of claim 1, wherein the catalyst-containing compound is introduced to the reactor separately from the silicon-containing precursor and the oxidant.

8. The method of claim 1, wherein the catalyst is a proton-donor catalyst.

9. The method of claim 1, wherein the catalyst-containing compound is a halogen-containing compound.

10. The method according to claim 1, wherein the flowable film is an updoped silicon oxide.

11. The method according to claim 1, wherein the flowable film is a carbon-doped silicon oxide.

12. The method according to claim 1, wherein the flowable film is a nitrogen-doped silicon oxide.

13. The method of claim 1, further comprising selective condensation in the gap.

14. The method of claim 4 wherein the catalyst-containing compound is selected from $(CH_3O)_3SiX$, $(CH_3CH_2O)_3SiX$, $(CH_3O)_2Si(H)X$, $(CH_3CH_2O)_2Si(H)X$, $(CH_3O)_2(CH_3)SiX$, $(CH_3CH_2O)_2(CH_3)SiX$, $(CH_3O)(CH_3)Si(H)X$, $(CH_3CH_2O)(CH_3)Si(H)X$ and $(CH_3)_3SiN(H)Si(CH_3)_3$, $HSiX_3$ or $SiX_4$ wherein X is a halogen.

15. The method of claim 6, wherein the catalyst and silicon-containing precursor flow comprises a silicon-containing precursor having between about 0.01-2% halogen impurity.

16. A method of filling a gap on a substrate with a dielectric film comprising:
    introducing process gases comprising a silicon-containing precursor, an oxidant and a catalyst-containing compound to a reaction chamber housing the substrate;
    exposing the substrate to the process gas under conditions such that a condensed flowable film forms and at least partially fills the gap, wherein the catalyst is selected from substituted or unsubstituted onium cations.

17. The method of claim 16, wherein the method comprises a base-catalyzed condensation.

* * * * *